US007653752B2

(12) United States Patent
Dewa

(10) Patent No.: US 7,653,752 B2
(45) Date of Patent: *Jan. 26, 2010

(54) DISTRIBUTION CONTENTS FORMING METHOD, CONTENTS DISTRIBUTING METHOD AND APPARATUS, AND CODE CONVERTING METHOD

(75) Inventor: Yoshiharu Dewa, Tokyo (JP)

(73) Assignee: Sony Corporation (JP)

( * ) Notice: Subject to any disclaimer, the term of this patent is extended or adjusted under 35 U.S.C. 154(b) by 28 days.

This patent is subject to a terminal disclaimer.

(21) Appl. No.: 11/903,924

(22) Filed: Sep. 25, 2007

(65) Prior Publication Data

US 2008/0028101 A1 Jan. 31, 2008

Related U.S. Application Data

(63) Continuation of application No. 09/786,878, filed as application No. PCT/JP00/04644 on Jul. 12, 2000, now Pat. No. 7,308,508.

(30) Foreign Application Priority Data

Jul. 13, 1999 (JP) .................................. 11-198483

(51) Int. Cl.
*G06F 15/16* (2006.01)
(52) U.S. Cl. ........................................ 709/247; 715/242
(58) Field of Classification Search ................. 709/247; 715/242
See application file for complete search history.

(56) References Cited

U.S. PATENT DOCUMENTS

| 4,843,389 | A | 6/1989 | Lisle et al. |
| 5,506,580 | A | 4/1996 | Whiting et al. |
| 5,854,597 | A | 12/1998 | Murashita et al. |
| 5,956,724 | A | 9/1999 | Griffiths |
| 5,991,713 | A | 11/1999 | Unger et al. |
| 5,999,949 | A | 12/1999 | Crandall |
| 6,163,780 | A | 12/2000 | Ross |
| 6,163,811 | A | 12/2000 | Porter |
| 6,304,601 | B1 | 10/2001 | Davison et al. |

(Continued)

FOREIGN PATENT DOCUMENTS

DE 19622365 12/1997

(Continued)

OTHER PUBLICATIONS

A.V. Kadach, *Text and Hypertext Compression*, Programming and Computer Softwared, vol. 23, No. 4, 1997, pp. 212-219.

(Continued)

*Primary Examiner*—David Lazaro
(74) *Attorney, Agent, or Firm*—Lerner, David, Littenberg, Krumholz & Mentlik, LLP

(57) ABSTRACT

A script is scanned to detect character strings that match predetermined criteria. The detected character strings are sorted in order of their appearance frequency and are associated with substitute characters or character strings such that a character string having a greater appearance frequency than another character string is associated with substitute characters or character string having a same or smaller number of characters. The script is searched for a given character string, and the given character string is replaced with its associated substitute characters or character strings. The content is unidirectionally distributed whereby the plurality of character strings is not distributed.

21 Claims, 14 Drawing Sheets

U.S. PATENT DOCUMENTS

| | | |
|---|---|---|
| 6,311,223 B1 | 10/2001 | Bodin et al. |
| 6,330,574 B1 | 12/2001 | Murashita |
| 6,635,088 B1 | 10/2003 | Hind et al. |
| 2002/0108101 A1 | 8/2002 | Charisius et al. |

FOREIGN PATENT DOCUMENTS

| | | |
|---|---|---|
| EP | 0313191 | 4/1989 |
| JP | 61-204741 A | 9/1986 |
| JP | 62-166408 A | 7/1987 |
| JP | 63-026728 A | 2/1988 |
| JP | 63-213030 A | 9/1988 |
| JP | 4-130541 | 5/1992 |
| JP | 04-299411 | 10/1992 |
| JP | 7-064798 A | 3/1995 |
| JP | 9-114813 A | 5/1997 |
| JP | 10-063492 A | 3/1998 |
| JP | 10-283233 A | 10/1998 |
| WO | WO-00/70770 | 11/2000 |

OTHER PUBLICATIONS

Japanese Office Action issued on Aug. 5, 2008 in connection with corresponding Japanese Application No. 11-198483.

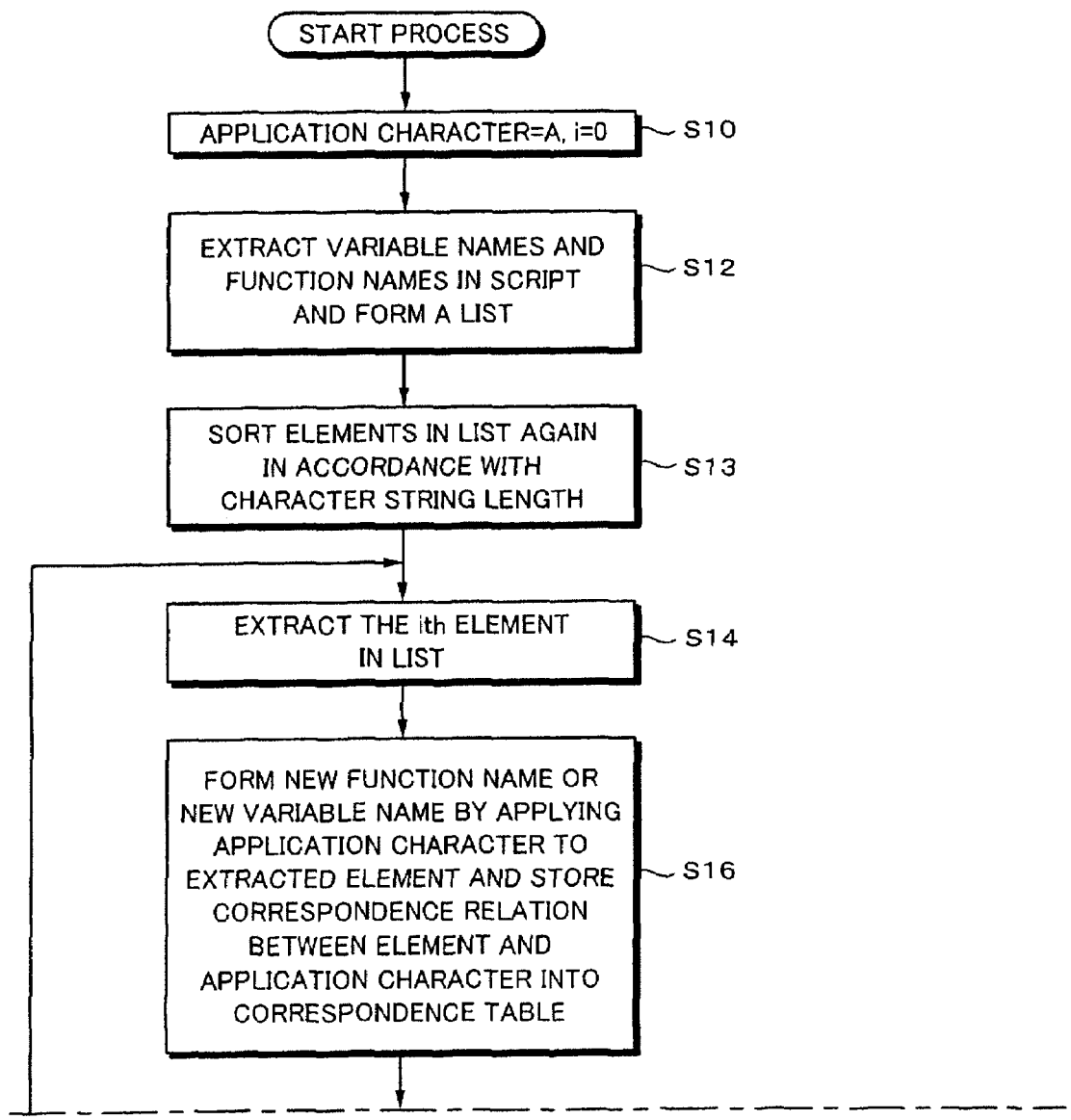

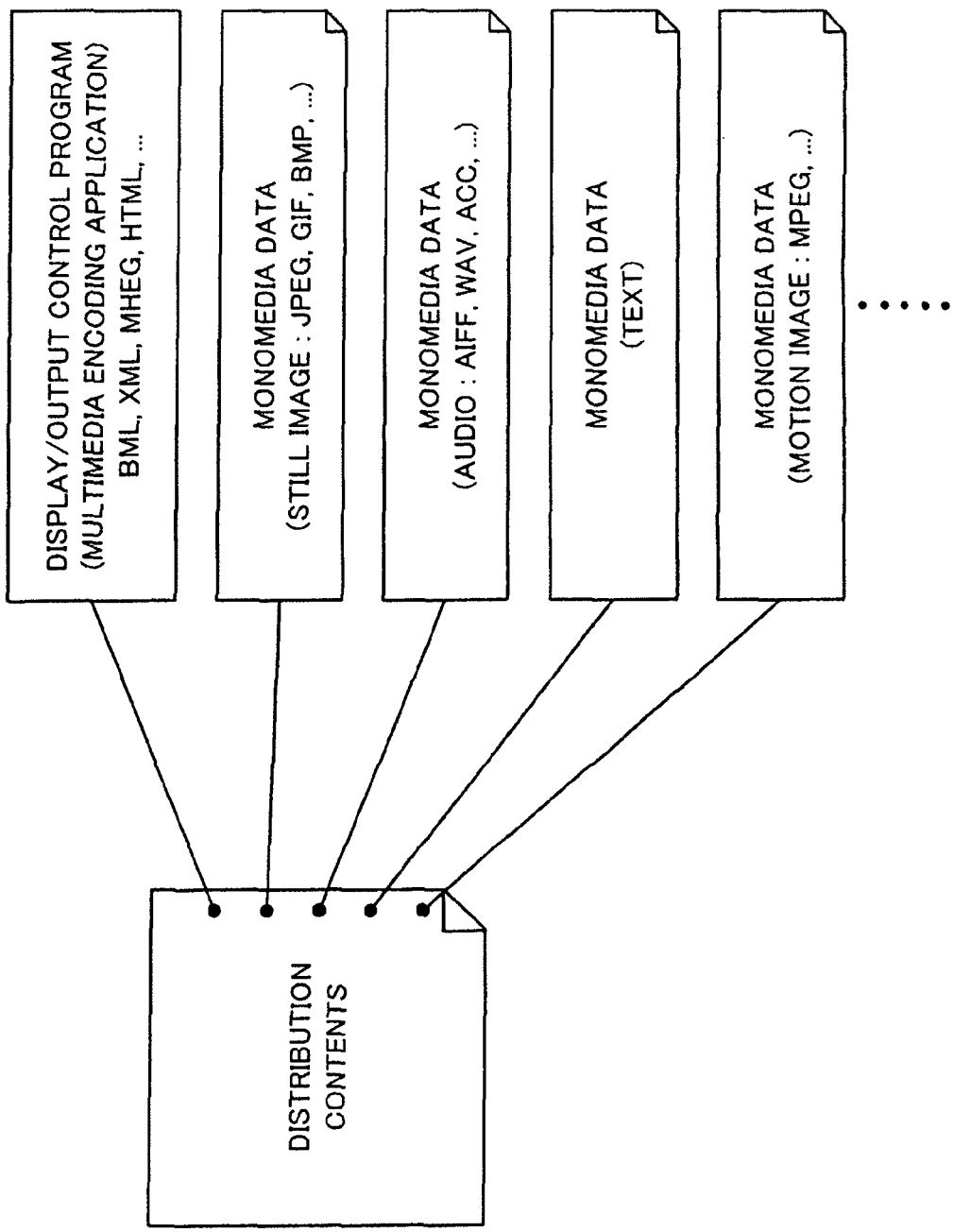

DISTRIBUTION CONTENTS FORMING METHOD, CONTENTS DISTRIBUTING METHOD AND APPARATUS, AND CODE CONVERTING METHOD

CROSS-REFERENCE TO RELATED APPLICATIONS

This application is a continuation of U.S. application Ser. No. 09/786,878, filed on Jul. 19, 2001, now U.S. Pat. No. 7,308,508, issued Dec. 11, 2007, which is a national phase entry under 35 U.S.C. § 371 of International Application No. PCT/JP00/04644, filed Jul. 12, 2000, which claims priority from Japanese Application Publication No. JP 11-198483, filed Jul. 13, 1999, the disclosures of which are incorporated by reference herein.

BACKGROUND OF THE INVENTION

The invention relates to a digital data distributing technique in a satellite digital broadcast, communication of multimedia content, or the like and, more particularly, to a technique for distributing digital data constructed by commands of a computer language.

In more detail, the invention relates to a digital data distributing technique for distributing digital data in a markup language (for example, XML (eXtensible Markup Language)) format using a tag which can be arbitrarily defined and, more particularly, to digital data distribution for improving a transmitting efficiency of distribution content comprising text data such as what is called a script or the like and an executing efficiency on the reception side.

In a technical field of a broadcast, digitization of data is rapidly being promoted. A digital signal has a more excellent stability and a higher data compression ratio than those of an analog signal. According to the digital signal, a larger number of channels than that of the analog signal can be assured in a predetermined band irrespective of a cable, a ground wave, and a satellite wave. Although the information in a document, an audio sound, and a video image are each quite different in the conventional information transmission, by digitizing broadcast data, they can be transmitted without being separated.

For example, in case of digital data, by transmitting various system information such as EPG (Electric Program Guide) or the like together with video information and audio information, services to the user (viewer) can be improved (the EPG incorporates a function for a recording reservation or the like to a VTR in addition to presenting information such as broadcast schedule, program names, and the like of broadcast programs).

Data in a digital format has a high affinity with information equipment such as a general computer system other than a television. For example, a tuner card for a satellite broadcast is attached to the general computer system, received EPG data is analyzed in the computer, a program table is displayed as a window on a computer display, and a program switching, a recording reservation, or the like can be realized by the operation of a mouse cursor. Naturally, broadcast data can be also digitally recorded as it is onto a hard disk built in the computer.

By transmitting data such as video image, audio sound, and the like other than the broadcast program main body by using a band, interactive performance of the broadcast program can be raised. For example, in case of a broadcast program such that alternative quiz is provided, by transmitting answers together with the video/audio data, on the satellite television broadcast receiver (namely, viewer) side, an answer menu button is prepared on the computer display and marking can be performed in response to the answering operation by a pointing device such as a mouse cursor or the like.

If the interactive performance is further raised, not only a home-use television receiver merely deals with video content but also it can be expected that it jumps as an information control tower. For example, the television receiver can become an Internet terminal or an electronic commerce terminal.

In Japan, the standardizing work regarding digital satellite data broadcast has been being progressed mainly by the ARIB (Association of Radio Industries and Businesses). According to it, in the digital satellite data broadcast, in addition to the audio/video data (AV data) constructing the satellite broadcast program main body, digital transmission data accompanied by the broadcast program is distributed in parallel therewith. More specifically, the program is propagated as a broadcast wave in a format of a "transport stream" (which will be explained below) constructed by multiplexing the AV data compressed by a predetermined compression system such as an MPEG (Motion Picture Experts Group) 2 or the like and the digital transmission data.

An example of broadcast program information which is multiplexed to the digital transmission data is the foregoing EPG (Electric Program Guide: electric program information). The broadcast program information can include particular information regarding the broadcast program main body such as title and date of the broadcast program main body, casting of the program, and the like. The kind of data included in the broadcast program information and its data structure are systematized to a certain extent in accordance with the service content which are provided by the program main body. For example, there are information regarding a menu and ingredients in a cooking program, a vote situation which is successively updated in an election spot news program, a personal record regarding the batting or pitching of each player and a place of a team in a professional baseball relay, and the like.

On the digital satellite data broadcast receiving system (hereinafter, simply referred to as "receiving system") side, the broadcast program information is displayed by using a partial area of a display screen for displaying and outputting the broadcast program main body. The receiving system is usually constructed by a receiver (set-top-box: STB) for receiving, station selecting, and decoding the broadcast wave and a television for displaying and outputting it and installed to an ordinary home.

A structure of content (hereinafter, referred to as "distribution content") which is distributed as digital transmission data will now be described with reference to FIG. 13.

As shown in FIG. 13, the distribution content is constructed by: various kinds of monomedia data such as still image, motion image, audio sound, and the like in addition to text data; and a display/output control program (hereinafter, also referred to as a "multimedia encoding application") which integratedly deals with those monomedia data, that is, as multimedia and specifies a state of the broadcast program information. Reference (link) information for each monomedia data can be built in the display/output control program.

In the foregoing standardizing work of the digital satellite data broadcast by the ARIB, the use of an MHEG (Multimedia and Hypermedia Expert Group) has initially been examined as a format of describing the multimedia encoding application as distribution content. The MHEG is a kind of description language which defines data attributes and presumes an application such that multimedia content is displayed on the television and the viewer extracts desired information in a video-on-demand (VOD) or digital television broadcast. Like a Japanese CS digital broadcast (SKYPerfecTV), there is also a case where the MHEG-5 has already been used.

However, according to the MHEG, an encoding space is fixed and it lacks expandability. That is, since it has to be described by using only the encoding space which has unconditionally been fixed, for example, even if one function (API (Application Programming Interface) or the like) is changed, a considerable correcting work is needed. According to the MHEG, a general recognition degree is low, the data content described by the MHEG is not so frequently circulated, and an affinity with a general computer is relatively low in terms of this meaning.

In the ARIB (mentioned before), therefore, the standardizing work of a data broadcast based on an XML (extended Markup Language) is being examined in place of the MHEG.

According to the XML, since a tag is arbitrarily defined, that is, there is no limitation in a method of describing attributes, points that a degree of freedom is high, an affinity with a general computer or Internet is high, and the like can be mentioned as points which are more advantageous than those of the MHEG. A work to set the XML to a description language of the Internet of the next generation is also being progressed.

In case of using the XML as a standard language of the digital satellite broadcast, information of the data for digital broadcast can be exchanged among various kinds of information equipment such as computer, television, telephone, and the like. According to the XML, since the attributes of the tag can be arbitrarily defined, it is stronger against the data processes as compared with the HTML specified to a layout designation. Therefore, the application of the XML to each field including an electronic commerce is also rapidly progressing.

A point that the arbitrary setting of the tag in an XML document means, in other words, that it is an object that a character string written in the document is handled as meaningful data. That is, by the definition of the tag, the tag data divided by each tag can be expressed as data having a meaning other than a mere display object. Further, by defining a structure of the tag, the XML document or the data in the document can be structured and described.

As already mentioned above, in the ARIB, the standardization of the digital satellite data broadcast is being progressed on the basis of the XML. More specifically, the work is separately executed with respect to "basic XML" and "advanced XML" as an expanded edition of the basic XML. According to the basic XML, it is specified that a presentation format which expresses an XML instance onto the display is described by using a tag.

On the other hand, the advanced XML enables attribute information of the XML instance to be added. A rule defining a describing method of the attribute information (that is, grammar of the tag) is a regulation called DTD (Document Type Definition). In the basic XML, the attribute information which is defined by the tag is fixed and the DTD is unnecessary. On the other hand, in the advanced XML, the DTD can be arbitrarily defined. For example, the DTD can be unconditionally defined every field. The attribute information of the tag which is used here includes information that is necessary in the case where when different types of apparatuses such as television receiver and computer are connected, each apparatus mutually understands the meaning of the content and processes the content and the like.

There is also a case where the XML instance itself does not incorporate style information regarding an expressing format. In this case, an expressing method of the XML instance is described by "style sheet" as a document file different from the DTD.

The style sheet is a document file for converting, for example, the XML instance into a format to display and output it onto the display screen (or converting into a print output format to a printer). The style sheet for the XML instance can be described by using, particularly, a language in an "XSL (extensible Stylesheet Language)" format, a "CSS (Cascade Stylesheet)" format, or an "XSLT (XSL Transformation)" format as a derivative standard thereof. In dependence on the description of the style sheet, the same DTD content can be expressed by exactly another format by changing font or its size and color and the like. The style sheet is transmitted as a file different from the DTD.

Besides the style sheet, with respect to the multimedia content comprising each monomedia such as audio sound, still image, motion image, and the like, in the XML instance or style sheet, the operation can be also specified by a language called a script different from the XML or XSL. Although such a script is described by a script language such as JavaScript, ECMAScript, Jscript, or the like, according to the standard of the XML, XSL, or the like, fundamentally, it is specified that the script is described by ECMAScript ("ECMAScript" is a script language standardized by European Computer Manufactures Association (ECMA)).

The distribution content comprising the XML document is accompanied with, for example, the DTD document and style sheet besides the XML document. However, there is also a case where the DTD document is not included in the XML document or the style sheet is sent at a timing different from that of the distribution of the XML document. The description language of the distribution content is not always limited to the XML but can also use another markup language format such as SGML (Standard Generalized Markup Language), HTML, or the like. For example, if the XML document is applied to the TV broadcast and operates together with another real-time type data and presentation is performed, there is also a case where monomedia position information in a broadcast data module called URI (Uniform Resource Identifier) of various monomedia content is also built in the XML document main body.

On the receiving system side, the received XML instance is parsing processed by a syntax analyzing program called "XML Parser". That is, the XML parser analyzes structures of the DTD document and XML instance and outputs a document object. The document object is a structured document whose tree structure has been formed in accordance with the tags in the original XML document. According to the display function of the receiving system, by interpreting the structure of the document, a layout or the like on the screen is determined and can be display outputted to the display.

In case of distributing digital data by transmitting means such as broadcast, network communication, or the like, there is a method whereby the data content such as XML document, script, or the like is data compressed from the original text format to a description of a binary (binary display) format and transmitted.

However, since a file structure of the binary format differs depending on a computer system or software, it can become an obstacle of exchange of the content between an application and a terminal. As an upstream line of the digital satellite data broadcast, the Internet which is connected on the basis of a TCP/IP (Transmission Control Protocol/Internet Protocol) is presumed. According to this Internet, there are historical circumstances such that by using a content distribution in a text format, an environment which does not depend on the kind of terminal and the software has been established.

In the digital satellite data broadcast, therefore, a method of distributing the data content as they are in the text format has been examined in consideration of the affinity with the Internet and the compatibility of the content between platforms.

A size of text data as distribution content becomes a problem here. This is because a load of a transmission path increases and a transmitting efficiency decreases in proportion to the data size.

For example, with the progress of the realization of a high function or the realization of an advanced additional value of the XML document, a document size of the script which specifies the expressing format and operation increases. In future, it is presumed that the data size of script will be larger than that of the XML document main body as a display target itself. An influence which is exerted on a load of a finite band by the distribution of the increased script is large.

Also in a receiving apparatus for receiving the distribution content, it is necessary to prepare a buffer memory of a large capacity in order to receive a large amount of data, causing an increase in costs. Since time that is required for loading into the memory also becomes long, the executing efficiency deteriorates.

In case of using a general computer system as a receiving system, usually, since the memory of a large capacity has been installed as a standard memory, the problem on the memory load is relatively small. On the other hand, in case of a dedicated satellite broadcast receiver such as a set-top-box, since a size of standard memory is generally small, the distribution content of a large capacity is fatal.

It is an object of the invention to provide an excellent data distributing technique which can improve transmitting efficiency of a distribution of content comprising text data.

Another object of the invention is to provide an excellent data distributing technique which can improve execution efficiency in a receiving apparatus for receiving distribution content comprising text data and reduce a memory load.

SUMMARY OF THE INVENTION

The invention is made in consideration of the above problems and according to the first aspect of the invention, there is provided a method of forming distribution content, comprising:

searching the inside of a script comprising a plurality of characters or character strings formed as one of modules constructing the distribution content and extracting the characters or character string having high redundancy; and replacing the characters or character string having high redundancy extracted from the script with characters or character string having low redundancy. The characters or character string having high redundancy corresponds to, for example, a function name, a variable name, or the like.

The distribution content forming method according to the first aspect of the invention can further include a step of temporarily storing the distribution content obtained after the replacement before distributing the distribution content.

In the step replacing the characters or character string having high redundancy with the characters or character string having low redundancy, the use of a system reserved word as a character string having low redundancy can be also eliminated. This is because if up to the system reserved word is extracted and replaced with other characters or character string, it is accompanied with a change in meaning which the original script inherently has, that is, a change in operation content which are specified by the script, and it is improper to permit such a replacement.

The distribution content forming method can further include the steps of: extracting a sentence comprising characters or character string which is not concerned with processes which are executed on the reception side of the distribution content; and deleting the extracted sentence. The sentence comprising characters or character string which is not concerned with the processes here corresponds to, for example, a comment sentence divided by a predetermined delimiter.

The distribution content forming method can further include a step of storing an appearance frequency in the script with respect to each of the characters or character string extracted by the step of extracting the characters or character string of the high redundancy, and in the step of replacing the characters or character string of the high redundancy with the characters or character string of the low redundancy, the characters or character string having a large appearance frequency can be also replaced with the characters or character string whose number of characters is small. Since the characters or character string of the large appearance frequency is expressed by the characters or character string whose number of characters is small, a data compressing effect is raised.

According to the second aspect of the invention, there is provided a content distributing method or apparatus for distributing content constructed by a plurality of data modules, comprising:

a step or means for searching the inside of the data module described in a script language format constructed by a plurality of characters or character strings and extracting the characters or character string having high redundancy;

a step or means for replacing the characters or character string of the high redundancy extracted in a script with the characters or character string having low redundancy;

a step or means for storing the replaced data module; and a step or means for distributing the stored data module. The characters or character string of the high redundancy here corresponds to, for example, a function name or a variable name.

In the step or means for replacing the characters or character string of the high redundancy with the characters or character string of the low redundancy, the use of a system reserved word as a character string of the low redundancy can be also eliminated. This is because if even the system reserved word is extracted and replaced with other characters or character string, it is accompanied with a change in meaning which the original script inherently has, that is, a change in operation content which are specified by the script and it is improper to permit such a replacement.

The content distributing method or apparatus according to the second aspect of the invention can further include: a step or means for extracting a sentence constructed by the characters or a character string which is not concerned with processes which are executed on the reception side of the distribution content; and a step or means for deleting the extracted sentence. The sentence constructed by the characters or a character string which is not concerned with the processes here corresponds to a comment sentence divided by a predetermined delimiter.

The content distributing method or apparatus according to the second aspect of the invention can further include: a step or means for storing an appearance frequency in the script with respect to each of the characters or character string extracted in the step of extracting the characters or character string of the high redundancy, and in the step or means for replacing the characters or character string of the high redundancy with the characters or character string of the low redundancy, the characters or character string of the large appearance frequency can be also replaced with the characters or character string whose number of characters is small. Since the characters or character string of the large appearance frequency is expressed with the characters or character string whose number of characters is small, a data compressing effect is raised.

According to the third aspect of the invention, there is provided a method of converting a source code constructed by a plurality of characters or character strings having a meaning regarding computer processes, comprising:

searching the inside of the source code and extracting characters or character string having high redundancy; and replacing the extracted characters or character string of the high redundancy with characters or character string having low redundancy. The character string of the high redundancy here corresponds to, for example, a function name or a variable name.

In the code converting method according to the third aspect of the invention, in the step of replacing the characters or character string of the high redundancy with the characters or character string of the low redundancy, the use of a system reserved word as a character string of the low redundancy can be also eliminated. This is because if even the system reserved word is extracted and replaced with other characters or character string, it is accompanied with a change in meaning which the original script inherently has, that is, a change in operation content which are specified by a script, and it is improper to permit such a replacement.

The code converting method according to the third aspect of the invention can further include the steps of: extracting a sentence constructed by characters or a character string which is not concerned with the execution of the code in the source code; and deleting the extracted sentence. The sentence constructed by the characters or character string which is not concerned with the execution of the code here corresponds to a comment sentence divided by a predetermined delimiter.

The code converting method according to the third aspect of the invention can further include a step or means for storing an appearance frequency in the script with respect to each of the characters or character string extracted in the step of extracting the characters or character string of the high redundancy, and in the step or means for replacing the characters or character string of the high redundancy with the characters or character string of the low redundancy, the characters or character string having a large appearance frequency can be also replaced with the characters or character string whose number of characters is small. Since the characters or character string of the large appearance frequency is expressed by the characters or character string whose number of characters is small, a data compressing effect is raised.

In the digital satellite data broadcast, the invention can be preferably applied to digital transmission data which is distributed together with a broadcast program, particularly, to a data file described in a text format in the transmission data.

The module constructing the digital transmission data comprises: various kinds of monomedia data such as still image, motion image, audio sound, and the like; and a display/output control program for integratedly treating with those monomedia data, that is, as multimedia and specifying a state of broadcast program information (below, such a program is also referred to as a "multimedia encoding application").

Among the files in the module, one of the files constructed by text format data is a display/output control program and its content is described by a markup description language (XML, SGML, HTML, or the like) in which data attributes are defined by a tag.

Another text format data included in the module is a script which specifies the operation of the various media data such as audio sound, still image, motion image, and the like. The script can be described by a script language such as JavaScript, ECMAScript, JScript, or the like (according to the standard of XML, XSL, or the like, it is fundamentally specified so as to describe it by ECMAScript).

The display/output control program itself described in the XML format or the like is a program in which the information itself which is screen displayed or print outputted is specified, and since a change of the content of the text data is accompanied with a change in meaning of the data itself (that is, the operation specified by the program), it is improper to permit such a change.

On the other hand, in case of the script, the function name or variable name included in the code, the comment sentence, or the like includes redundancy and it is fatal on a transmitting efficiency. The function name, variable name, or the like has inherently been named by a person who made the script for the purpose of convenience of improving the readability in the coding or debugging operation (or in accordance with a personal favor), and they have no relation with the operating function which is specified by the script itself. In other words, those function name and variable name can be exchanged with other character string while maintaining the operating function of the script itself. The comment sentence has no relation with the execution of the script and can be also omitted.

The invention is made by paying attention to the redundancy incorporated by the script described in such a text format. In brief, according to the invention, a data size of the script is reduced by replacing the function name or variable name which exists in the script and comprises a relatively long character string with a shorter character string (for example, one alphabetical character). The data size is further reduced by deleting a comment sentence in the script.

The function name or variable name in the script has been named by the person who made the script for the purpose of convenience of keeping the readability by human eyes of each function or variable and is constructed by a relatively long character string having a meaning which a person can understand. Although the comment sentence is embedded into the source code in order to memorize the function of each portion (for example, a routine sentence or the like) in the script, the comment sentence itself does not contribute to the realization of the function of the script.

Although the function name or variable name constructed by the long character string and the comment sentence have a meaning up to a position of the debug, there is no need to have a meaning which can be interpreted by the person after the debug. Particularly, in case of applying them to unidirectional content distribution such as a satellite data broadcast, there is no need to consider the reuse of the source code at the stage after the transmission. In other words, even if the function name or variable name in the script is replaced with another short character string or it becomes difficult for the person to interpret the meaning and contents of the source code because of the deletion of the comment sentence, there is hardly an adverse influence.

By applying the invention to the digital transmission data in the digital satellite data broadcast, the size of transmission data can be reduced and a transmitting efficiency is improved upon distribution.

Since the size of reception data decreases in the broadcast server, it is sufficient to merely prepare a reception memory of a relatively small capacity and it contributes to the reduction of costs. Since a length of character string of the function name or variable name in the script is minimized, a size of function table or variable table which is allocated to the memory from an interpreter for executing the script can be reduced. Thus, an overhead at the time when the function or variable is called decreases. That is, an executing efficiency of the script is improved, a capacity of the memory can be reduced, so that the costs for the receiver can be reduced. The user of the receiver (that is, viewer) can expect a system of a higher reacting speed owing to the improvement of the executing efficiency.

Further objects, features, and advantages of the present invention will be apparent by the more detailed description in conjunction with the embodiments of the invention, which will be explained below, and the drawings.

BRIEF DESCRIPTION OF THE DRAWINGS

FIG. 13 is a diagram showing a data structure of distribution content as digital transmission data.

DETAILED DESCRIPTION

An embodiment of the invention will now be described below with reference to the drawings.

Figure 1:
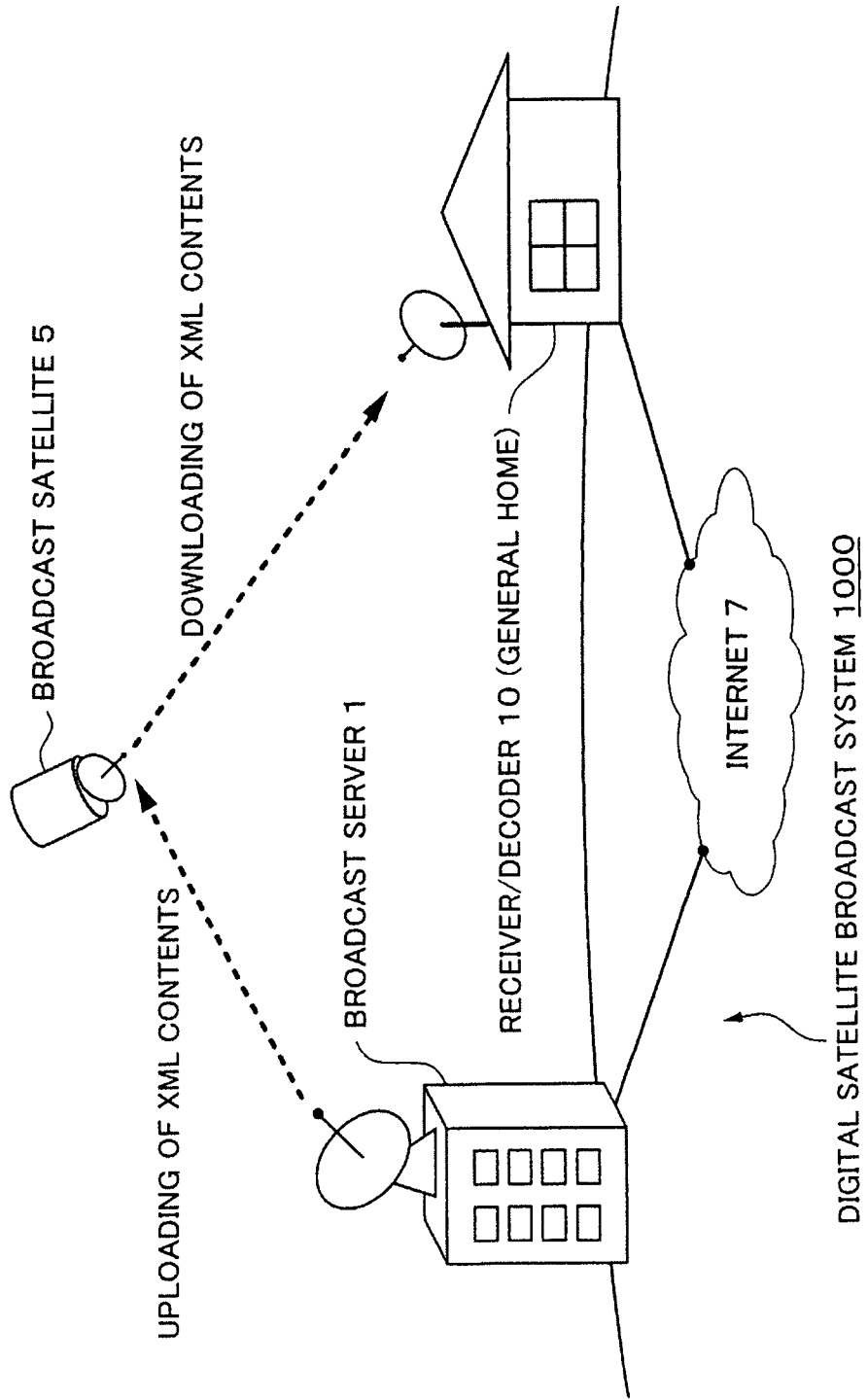
FIG. 1 is a diagram showing a construction of a satellite digital broadcast system which is embodied by the invention.

FIG. 1 shows a schematic construction of a satellite digital broadcast system 1000 which is embodied by the present invention. As shown in the diagram, the satellite digital broadcast system 1000 comprises: a broadcast station (Broadcast Server) 1 for providing broadcast services; a broadcast satellite (Satellite) 5 for relaying broadcast data; and a receiving station (Receiver/Decoder) 10 for receiving the broadcast data from the satellite 5.

One or more broadcast servers 1 exist on the ground. The satellite 5 exists in the sky fairly over the earth. The receiver/decoder 10 corresponds to an ordinary home or the like. Actually, a great number of receivers/decoders exist on the ground. The data distribution, that is, the broadcast via the broadcast server 1 and satellite 5 is unidirectional communication.

In the digital data distribution, data is transmitted at a transfer rate of 10 to 50 Mbps. The broadcast server 1 multiplexes AV data constructing a broadcast program main body and digital transmission data including program information accompanied by the broadcast program and distributes. The AV data is ordinarily compressed in an MPEG (Motion Picture Experts Group) 2 format and transmitted.

A module comprising various monomedia data such as text, still image, motion image, audio sound, and the like and "multimedia encoding application" as a program for controlling display and output of those monomedia data has been data carrouseled and stored in the digital transmission data. The multimedia encoding application includes: a DTD document which has been described in an XML (eXtensible Markup Language) language format and defines a type of document; and a style sheet described in a language format such as XSL or the like (however, there is also a case where the DTD document and/or the style sheet is not included in the distribution content). A script to specify the operation of the audio sound, still image, motion image, or the like is included in each module.

Each receiver/decoder 10 and broadcast server 1 can be also bidirectionally connected by a wide area network 7 such as the Internet, a dedicated line (not shown), or the like. In this case, the Internet 7 can be used as an upstream line directing from the receiver/decoder 10 to the broadcast server 1. For example, a partially-on-demand broadcast service using the Internet 7 can be also provided. In this case, however, it is desirable that they are connected by a high speed analog telephone line of 56 kbps or more, high speed wireless communication of about 10 to 64 kbps, ISDN (Integrated Services digital Network) of 128 kbps, or a cable on the class of 5 to 30 Mbps.

Figure 2:
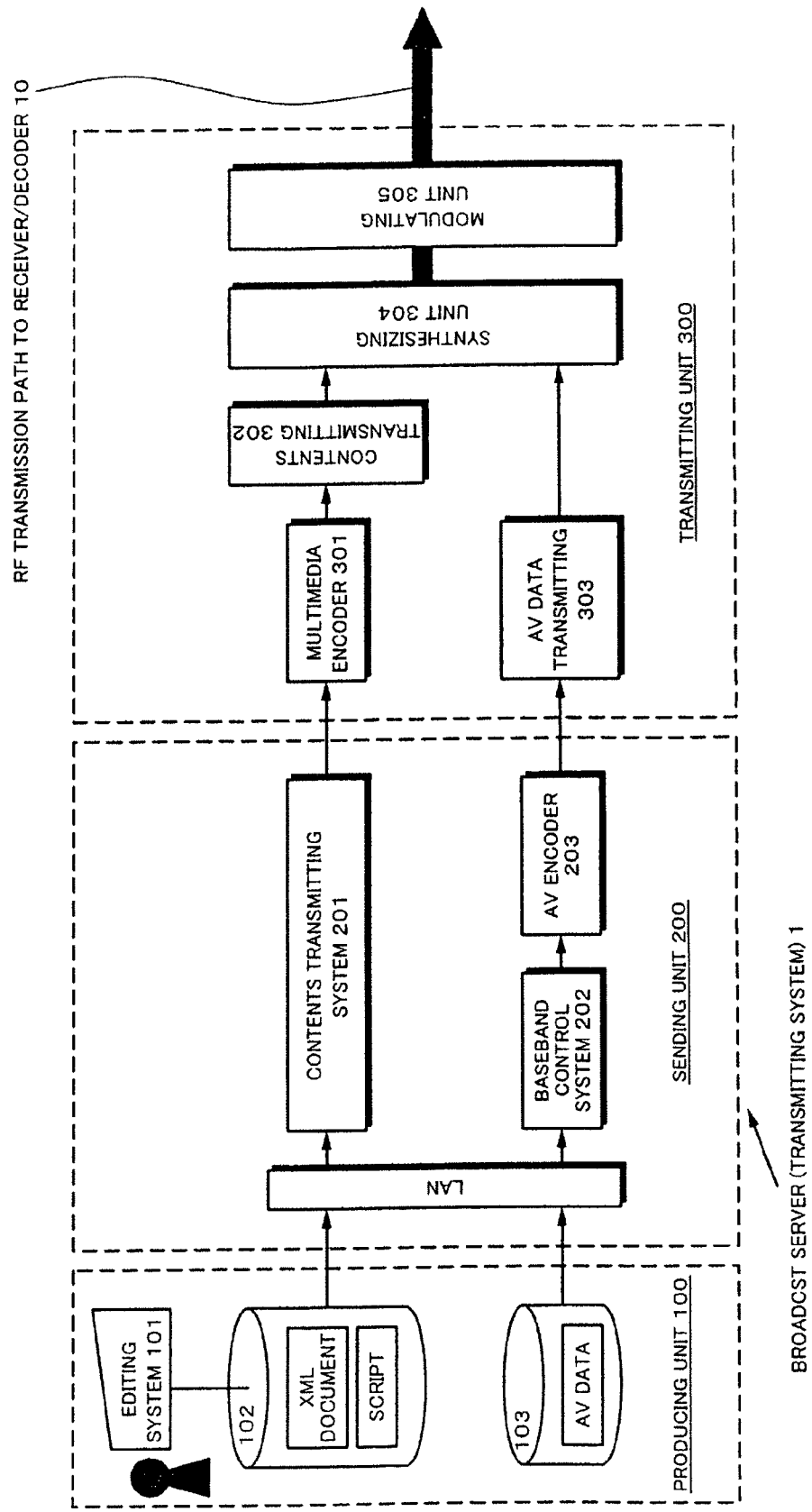
FIG. 2 is a diagram showing a construction of a broadcast server, that is, a transmitting system.

FIG. 2 schematically shows a construction of the broadcast server 1, that is, a transmitting system. The transmitting system 1 comprises a producing unit 100, a sending unit 200, and a transmitting unit 300. Each unit will be described below.

The producing unit 100 corresponds to the scene where content of the broadcast program is produced. The producing unit 100 produces an XML document describing the contents of the data broadcast, a script which specifies the operation of the XML document, and information such as AV data or the like as a main body of the broadcast program and stores them into local storing devices 102 and 103 of a large capacity, respectively.

The XML document and the script correspond to resources (which will be explained below; refer to FIGS. 7 and 8) of the resource of each module constructing the digital transmission data. The digital transmission data is subjected to an editing process such as coding/debug or the like on an editing system 101. The substance of the editing system 101 may be a general computer system called a workstation or personal computer.

The XML document is a markup language (mentioned before) using the tag which can be arbitrarily defined and a DTD document which defines a document type can be also annexed. The XML document in this case is a data main body for output in the receiver/decoder 10. The script is a script which specifies the operation of the XML document and is a file in a text format described by a script language such as JavaScript, ECMAScript, JScript, or the like (according to the standard of XML, XSL, or the like, it is fundamentally specified so as to describe the script by ECMAScript). The digital transmission data can also include multimedia content such as audio data, still image data, and the like besides the XML document and script.

Those distribution content produced and stored in the producing unit 100 is transferred to the sending unit 200 via, for example, an LAN (Local Area Network) established in the broadcast server 1.

In the sending unit 200, sending data is packetized by each of a content transmitting system 201, a baseband control system 102 and an AV encoder 203 and transferred to the transmitting unit 300. The AV encoder 203 encoding compresses the AV data as a main body of the broadcast program by a compression system such as MPEG2 or the like.

In the transmitting unit 300, the data of the content system is encoded in a multimedia encoding unit 301 and transferred to a content transmitting system 302. A synthesizing unit 304 synthesizes output data of each of the content transmitting system 302 and an AV data transmitting system 303. In a modulating unit 305, a synthesis signal is RF modulated and transmitted to the receiver/decoder 10 through an RF transmission path.

On the RF transmission path, the RF signal is first transmitted to the satellite 5 from a transmitting antenna installed in the broadcast server 1 and subsequently received by a receiving antenna of the receiver/decoder 10 via the satellite 5.

Figure 3:
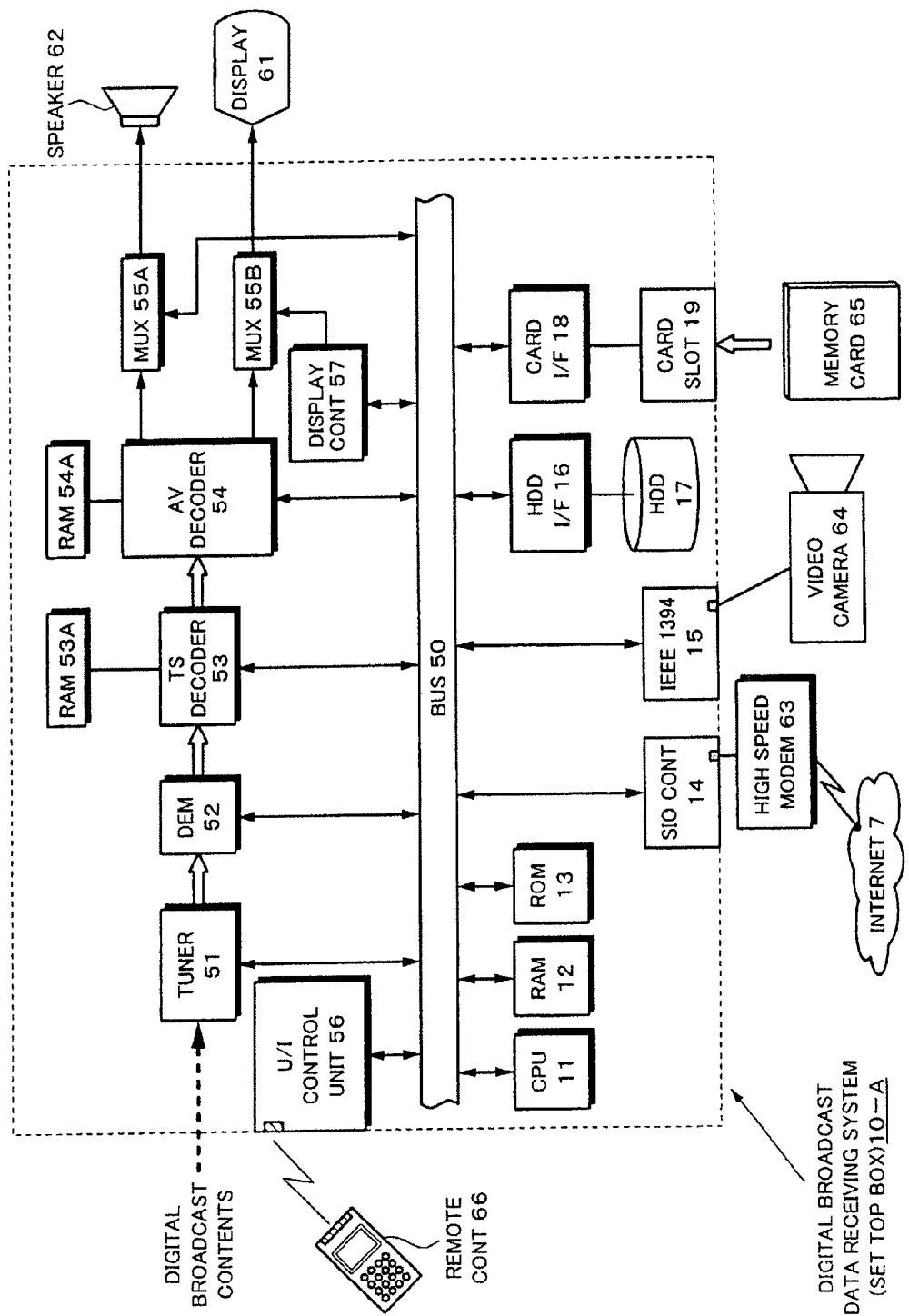
FIG. 3 is a diagram showing a hardware construction of an example of a receiving system in a receiver/decoder (that is, ordinary home), more specifically, a diagram showing a construction of the receiving system installed in a form called STB (set-top-box).

FIG. 3 schematically shows a hardware construction of the example 10-A of a digital satellite data broadcast receiving system which is installed in the receiver/decoder 10. The receiving system 10-A has been widespread to an ordinary home in a form called, for example, STB (set-top-box). In the receiving system 10-A, a CPU 11 as a main controller is mutually connected to each hardware component through a bus 50 and executes an integrated control to each component. Each unit will now be described below.

The broadcast wave received by the antenna (not shown) is supplied to a tuner 51. The broadcast wave conforms with a specified format and includes, for example, program guide information (EPG: Electric Program Guide) and the like. As a broadcast wave, a wired broadcast wave or a ground wave other than the foregoing broadcast wave can be used, and it is not particularly limited.

The tuner 51 performs tuning of the broadcast wave of a predetermined channel, that is, station selection and outputs reception data to a subsequent demodulator 52 in accordance with an instruction from the CPU 11. The demodulator 52 demodulates the digitally modulated reception data. A construction of the tuner 11 can be properly changed or expanded in accordance with whether the transmitted broadcast wave is an analog wave or a digital wave.

The demodulated digital data is "transport stream" constructed by multiplexing the AV data which was MPEG2 compressed and the digital transmission data. The former AV data is a video image and audio information constructing the broadcast program main body. The latter digital transmission data is data accompanied by the broadcast program main body and includes, for example, EPG (Electric Program Guide). The digital transmission data will be explained in detail below. The transport stream is classified into what is called "transport layer" in an OSI (open Systems Interconnection) reference model.

A TS decoder 53 interprets the transport stream, separates it into the MPEG2 compressed AV data and the digital transmission data, sends the former to an AV decoder 54, and transmits the latter to the CPU 11 via the bus 50. In the TS decoder 53, a memory 53A for storing operation data can be also equipped for its own local When the real-time AV data compressed by the MPEG2 system is received from the TS decoder 53, the AV decoder 54 separates it into compression video data and compression audio data. The video data is subjected to an MPEG2 decompressing process, thereby reproducing the original video signal. The audio data is PCM (Pulse Code Modulation) decoded and, thereafter, synthesized with an additional sound, thereby forming a reproduction audio signal. In the AV decoder 54, a memory 54A for storing operation data can be also equipped for its own local. The reproduction video signal is displayed and outputted onto a display 61 via a multiplexer 55B. The reproduction audio signal is outputted to a speaker 62 via a multiplexer 55A and generated as a sound.

A user interface control unit 56 is a module for processing the input operation from the user and has, for example, operation buttons/switches (not shown) for allowing the user to directly and manually operate and has a function for receiving a remote operation from a remote controller 66 via an infrared ray (IR) or the like. The control unit 56 can also include a display panel or an LED indicator (not shown) for displaying the current set content.

One of the operation buttons which the user interface control unit 56 has or one of operation buttons which the remote controller 66 has is allocated to a button for validating or invalidating a display output from an OSC display controller 57 (that is, display output such as program information or the like based on the digital transmission data).

The CPU (Central Processing Unit) 11 is a main controller for integratedly controlling the whole operation of the receiving system 10-A. The CPU 11 can execute processes of the digital transmission data which is transferred via the bus 50. The digital transmission data is described in the XML (eXtensible Markup Language) language format (which will be explained below). The CPU 11 can execute processing software (which will be explained below) such as XML parsing browsing (display output or print output) and the like for the XML document on a platform that is provided by the operating system (OS).

An RAM (Random Access Memory) 12 is a writable volatile memory which is used for loading an executing program code of the CPU 11 or writing operation data of the executing program. An ROM (Read Only Memory) 13 is a read only memory for permanently storing a self diagnosis and initializing program which is executed at the time of turn-on of a power source of the receiving system 10-A and storing microcodes for operation of the hardware.

A serial input/output (SIO) controller 14 is a peripheral controller for executing a serial data exchange with equipment out of the receiving system 10-A. A high speed modem 63 (for example, a transfer rate is equal to 56 kbps) for modulating and demodulating transmission data on an analog telephone line is externally connected to a serial port which is prepared by the SIO controller 14. By PPP (Point-to-Point Protocol) connecting to a predetermined access point (not shown) by the high speed modem 63, the receiving system 10-A is connected to the Internet 7 as a wide area network.

An IEEE1394 interface 15 is a serial high speed interface which can transmit and receive data at a transfer rate of about tens of MBps. External equipment corresponding to IEEE1394 can be connected to the IEEE1394 port in a daisy chain or tree manner. For example, a video camera 64, a scanner (not shown), and the like can be mentioned as equipment corresponding to IEEE1394.

A hard disk drive (HDD) 17 is an external storing device for storing the program, data, and the like in a file format of a predetermined format and usually has a relatively large capacity of about a few GB. The HDD 17 is connected to the bus 50 via a hard disk interface 18.

A card interface 18 is a device for realizing bus protocol between a card-type device 65 inserted in a card slot 19 and the bus 50. As an example of the card-type device 65, there is a PC card having a credit card size constructed as a cartridge type. The PC card conforms with the specification "PC Card Standard" specified by the PCMCIA (Personal Computer Memory Card Interface Association) and the JEIDA (Japan Electronic Industry Development Association) in cooperation with each other.

As an example of the PC card, there is a memory card constructed by a non-volatile, erasable, and rewritable memory chip such as an EEPROM (Electrically Erasable and Programmable ROM) or the like. If the receiving system 10-A is cheaply constructed in a relatively small size, there is a case where it is difficult on design to install the HDD 17 of a large capacity and a large volume. In such a case, it is presumed that it is preferable to apply a detachable and portable memory card to the system 10-A. However, the detachable memory 65 is not limited to a form factor of the PC card but may be also what is called "Memory Stick" (trademark).

The display controller 57 is a dedicated controller for controlling a display output of broadcast program information or the like based on the digital transmission data.

In the digital satellite data receiving system 10-A, the CPU 11 controls the station selecting operation of the tuner 51 and performs a display control of the program information and the like in accordance with commands inputted from the user via the user interface control unit 56. That is, the CPU 11 processes the data for digital broadcast transferred from the TS decoder 53, converts into data for display, and supplies it to the display controller 57. The display controller 57 generates an image signal of the program information on the basis of the display data and supplies to the multiplexer 55B. The CPU 11 also processes the audio data included in the data for digital broadcast and supplies it to the multiplexer 55A via the bus 50. The multiplexers 55A and 55B multiplex the display data and audio data supplied from the CPU 11 to the video data and audio data as a broadcast program main body that is outputted from the AV decoder 54 and externally output to the display 61 and speaker 62, respectively. Processes of the data for digital broadcast will be described in detail below.

Figure 4:
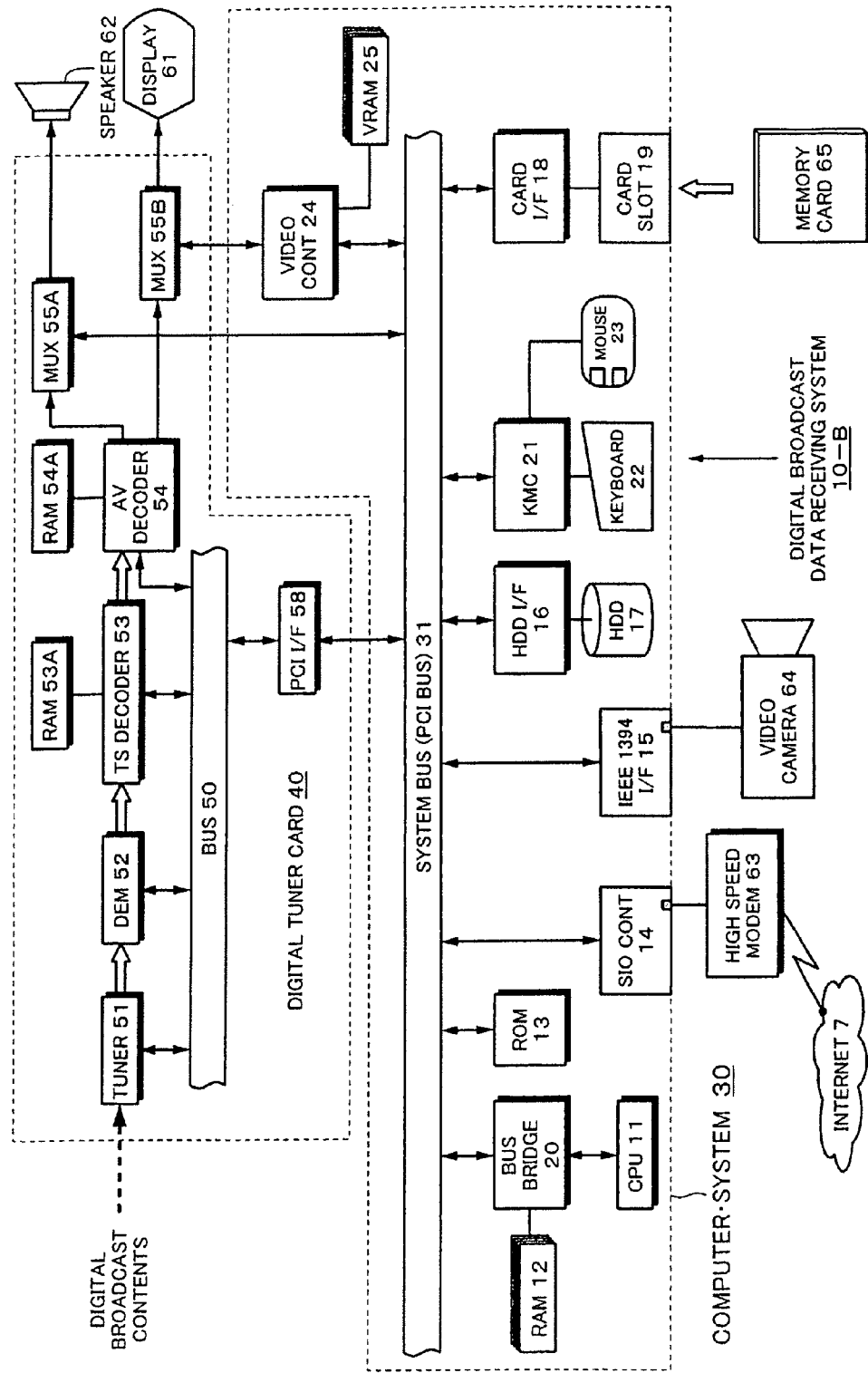
FIG. 4 is a diagram showing a hardware construction of a receiving system according to another example, more specifically, a diagram showing a hardware construction of the receiving system installed in a form such that a tuner card for satellite digital broadcast is installed in a general computer system.

FIG. 4 schematically shows a hardware construction of the digital broadcast data receiving system 10-B according to another example. For instance, the receiving system 10-B according to the example is installed in a form such that a digital tuner card 40 for satellite digital broadcast is inserted into a general computer system 30.

The digital tuner card 40 comprises the tuner 51, demodulator 52, TS decoder 53, AV decoder 54, RAMs 53A and 54A, and multiplexers 55A and 55B. A construction and functions of the system are almost the same as those of the hardware block having the same reference numerals shown in FIG. 3. The digital satellite broadcast tuner card 40 is connected to a system bus (PCI bus) 31 in the computer system 30 via a bus interface (PCI interface) 58 (shown).

The broadcast wave received from the antenna (not shown) is station selected by the tuner 51 and demodulated by the demodulator 52. The TS decoder 53 interprets the transport stream and separates it into the MPEG2 compressed AV data and the digital transmission data. The AV data is supplied to the AV decoder 54, processed in a manner similar to that mentioned above, and externally outputted to the display 61, speaker 62, or the like. The digital transmission data is transferred to the computer system 30 side via the PCI interface 58 and processed by the CPU 11 in the system (which will be explained below).

On the other hand, the general computer system 30 includes a printed circuit board (not shown) on which main circuit components as well as the CPU 11 (which will be explained below) are mounted. The board is also called "mother board". The foregoing tuner card 40 is provided in a form of, for example, "adapter card" and inserted into a bus slot (not shown) arranged on the mother board.

The tuner card 40 is not limited to the form of the adapter card but is provided in a form of a PC card which conforms with the specification set by the PCMCIA (Personal Computer Memory Card International Association)/JEIDA (Japan Electronic Industry Development Association) and inserted into the PC card slot 19 (which will be explained below), and is also assembled in the system construction of the computer system 30.

The CPU 11 is a main controller for integratedly controlling the whole operation of the computer system 30. The CPU 11 according to this example can execute various software programs (which will be explained below) for XML content processes such as XML parsing, XSL processing, browsing, and the like on the platform that is provided by the operating system (OS).

A processor bus connected directly to an external pin of the CPU 11 is mutually connected to the system bus 31 via a bus bridge 20.

The bus bridge 20 in the embodiment includes a memory controller for controlling a memory access to the RAM 12 in addition to a data buffer for absorbing a speed difference between the processor bus and the system bus 31.

The RAM (Random Access Memory) 12 is a writable volatile memory which is used for loading executing program codes of the CPU 11 and writing operation data of the executing program. Usually, it is constructed by a plurality of DRAM (dynamic RAM) chips.

The system bus 31 is a common signal transmission path including an address bus, a data bus, a control bus, and the like. For example, a PCI (Peripheral Component Interconnect) bus corresponds to it. Various peripheral equipment which conform with the PCI interface specification are mutually connected onto the system bus 31. As an example of the peripheral equipment, there is the digital satellite broadcast tuner card 40 mentioned above. A unique I/O address (or memory address) has been allocated to each peripheral equipment on the bus 31. The CPU 11 (more strictly speaking, the program which is executed by the CPU 11) can realize the transfer of data and commands to the desired peripheral equipment by designating the I/O address (or memory address).

The ROM (Read Only Memory) 13 is a read only memory for permanently storing a self diagnosis program (POST) which is executed upon turn-on of a power source of the computer system 30 and a basic input/output system (BIOS) for hardware operation. The ROM 13 can be constructed by, for example, an EEPROM (Electrically Erasable and Programmable ROM) which can perform the electrical erasing and rewriting operation.

The serial input/output (SIO) controller 14 is a peripheral controller for serially exchanging data with external equipment of the computer system 30. The high speed modem 63 (for example, transfer rate is equal to 56 kbps) for modulating and demodulating transmission data on an analog telephone line is externally connected to a serial port which is prepared by the SIO controller 14. The computer system 30 (that is, receiving system 10-B) is connected to the Internet by PPP (Point-to-Point Protocol) connecting to a predetermined access point (not shown) by the high speed modem 63.

The IEEE1394 interface 15 is a serial high speed interface which can transmit and receive data at about tens of MBps. External equipment corresponding to IEEE1394 can be connected to the IEEE1394 port in a daisy chain or tree manner. For example, the video camera 64, scanner (not shown), and the like can be mentioned as equipment corresponding to IEEE1394.

The hard disk drive (HDD) 17 is an external storing device for storing the programs, data, and the like in a file format of a predetermined format and usually has a relatively large capacity of about a few GB. The HDD 17 is connected to the system bus 33 via the hard disk interface 16. As an interface standard for connecting the hard disk drive to the computer system 30, for example, there is IDE (Integrated Drive Electronics), SCSI (Small Computer System Interface) or the like.

A keyboard/mouse controller (KMC) 21 is a dedicated controller for processing a user input from a keyboard 22, a mouse 23, or the like. The KMC 21 issues an interrupting request to the CPU 11 in response to a scan code input from the keyboard 22 or the detection of a coordinate instruction input from the mouse 23. In the embodiment, in addition to the ordinary command input to the computer system 30, the input operation such as selection of the channel or the like to the receiving system 10-B can be also performed through the keyboard 22 or mouse 23.

One of function keys which the keyboard 22 has or one of menu buttons arranged on the display 61 has been allocated to a button for operating the validation or invalidation of the display output (that is, display output of the program information or the like based on the digital transmission data) from a video controller 24.

The card interface 18 is a device for realizing a bus protocol between the bus 50 and the card-type device 65 inserted into the card slot 19. As an example of the card-type device 65, there is a PC card having a credit card size constructed in a cartridge type. The PC card conforms with the specification "PC Card Standard" set by the PCMCIA (Personal Computer Memory Card Interface Association) and the JEIDA (Japan Electronic Industry Development Association) in cooperation with each other.

As an example of the PC card, there is a memory card constructed by a non-volatile, erasable, and rewritable memory chip such as an EEPROM (Electrically Erasable and Programmable ROM) or the like. If the digital satellite broadcast receiving system 10-B is cheaply constructed in a relatively small size, there is a case where it is difficult on design to install the HDD 17 having a large capacity and a large volume. In such a case, it is presumed that it is preferable to apply a detachable and portable memory card to the receiving system 10-B. The detachable memory 65 is not limited to a form factor of the PC card but may be also what is called "Memory Stick" (trademark).

The video controller 24 is a dedicated controller for controlling a screen display in accordance with a draw command from the CPU 11 and has a frame memory (VRAM) 25 for temporarily storing draw information. To preferably embody the present invention, it is desirable that the video controller 24 has drawing ability (for example, SVGA (Super video Graphics Array) or XGA (extended Graphics Array)) over a VGA (Video Graphic Array).

In the digital satellite broadcast receiving system 10-B, the CPU 11 controls the station selecting operation of the tuner 11 in accordance with a command inputted from the user via the keyboard 22 or mouse 23 and performs a display control of the program information and the like. That is, the CPU 11 processes the digital broadcast data supplied from the TS decoder 53, converts it into the display data, and supplies to the video controller 24. The video controller 24 forms an image signal of the program information on the basis of the display data and supplies it to the multiplexer 55B. The CPU 11 also processes the audio data included in the digital broadcast data and supplies it to the multiplexer 55A via the bus 50. The multiplexers 55A and 55B multiplex the display data and audio data supplied from the CPU 11 to the video data and audio data as a broadcast program main body that is outputted from the AV decoder 54 and externally output to the display 61 and speaker 62, respectively. The processes of the digital broadcast data will be described in detail below.

To construct the satellite digital data receiving system 10, many electric circuits and the like besides the component elements shown in FIGS. 3 and 4 are necessary. However, since they are well-known to those in the ordinary skill in the art and do not construct the essence of the present invention, they are omitted in the specification. It should be noted that to avoid complicated connection of the drawings, only a part of the connections between the hardware blocks in the diagrams is illustrated.

For example, although not shown in FIGS. 3 and 4, the receiving system 10 can also have an external storing device such as FDD (Floppy Disc Drive), CD-ROM drive, or MO drive in which a portable recording media such as FD (Floppy Disc: trademark), CD-ROM, MO (Magneto-Optical disc), or the like is inserted and a data access can be performed.

Figure 5:
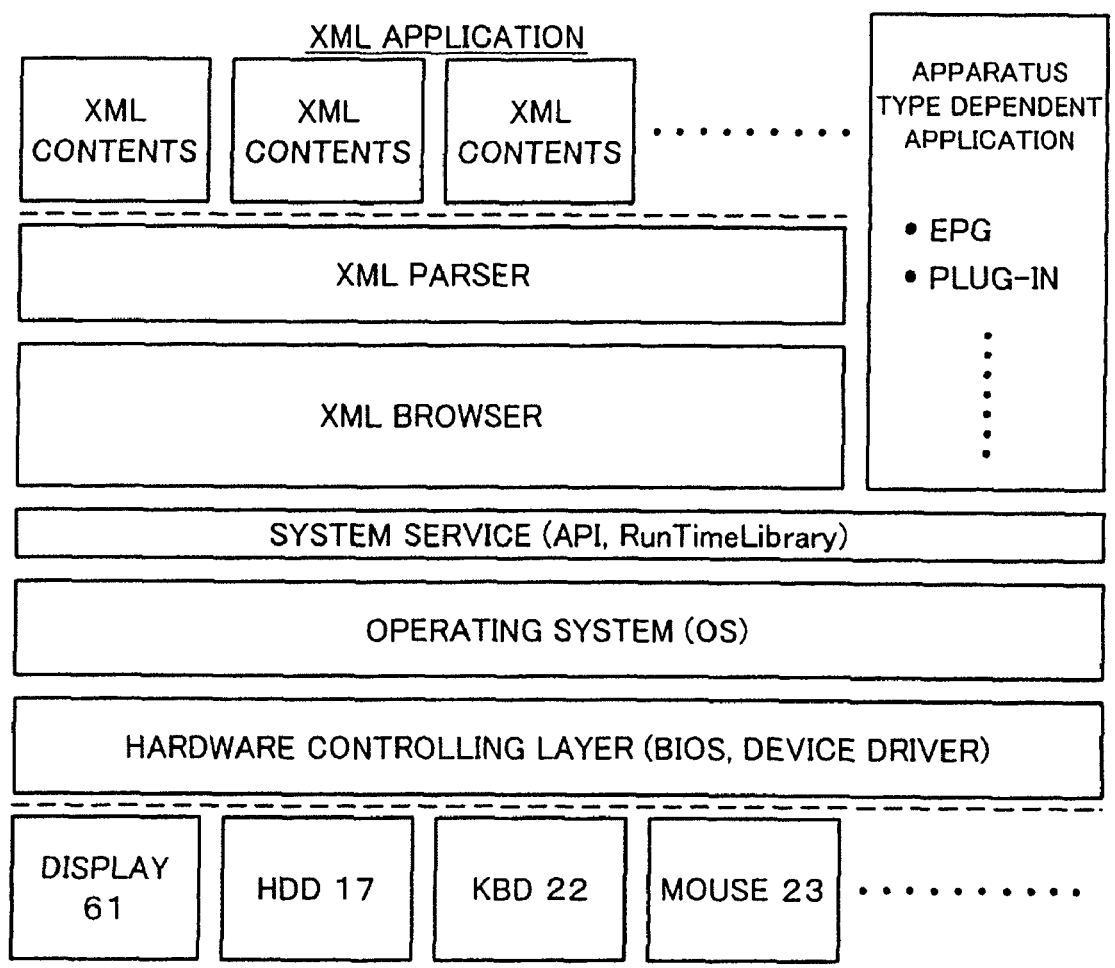
FIG. 5 illustrates a layer structure in various software programs which are executed by the digital broadcast data receiving system.

FIG. 5 schematically illustrates a layer construction among the various software programs which are executed in the digital broadcast data receiving system 10. A function of the software of each layer will be described below.

A hardware control layer as a bottom layer has an object to absorb a difference of the hardware from upper software such as an operating system (OS) or the like and executes the direct input/output operation to each hardware and processes corresponding to a hardware interruption.

The hardware control layer is provided to the digital satellite broadcast receiving system 10, for example, in a form such as BIOS (Basic Input/Output System) which has permanently stored in the ROM 13 or "device driver" installed in the HDD 17.

The operating system (OS) is basic software for integratedly managing the hardware and software in the satellite broadcast receiving system 10. The OS includes subsystems such as: "file manager" for managing the recording of files on the HDD 17; "memory manager" for managing a memory space; "resource manager" for managing distribution of system resources; "scheduler" for managing the task execution; "window system" for controlling a window display on the display; and the like.

A system service is a set of functions for allowing an upper program such as an application or the like to call each function from the OS. An API (Application Programming Interface) or run time library (or dynamic link library) corresponds to it. Owing to the existence of the system service, the application does not need to directly operate each hardware and the unity of the hardware operation is assured.

The XML application is a program for controlling a state of the display/output or the like of the data broadcast and is an XML document described by a language with a tag which can perform an arbitrary definition such as XML. Each XML document can be also accompanied with a style sheet such as DTD document for definition of a document style, XSL document which specifies a display format (or XSLT as a derivative standard of CSS or XSL) or the like.

The XML parser is a software program for analyzing the XML document by using the DTD document and transfers the document object as an analysis result to the XSL processor. The document object is a structured document in which a tree structure has been formed in accordance with the tag in the original XML document.

Subsequently, in the satellite data receiving system 10, a processing procedure for receiving the broadcast data will be described with reference to FIGS. 6 to 8.

Figure 6:
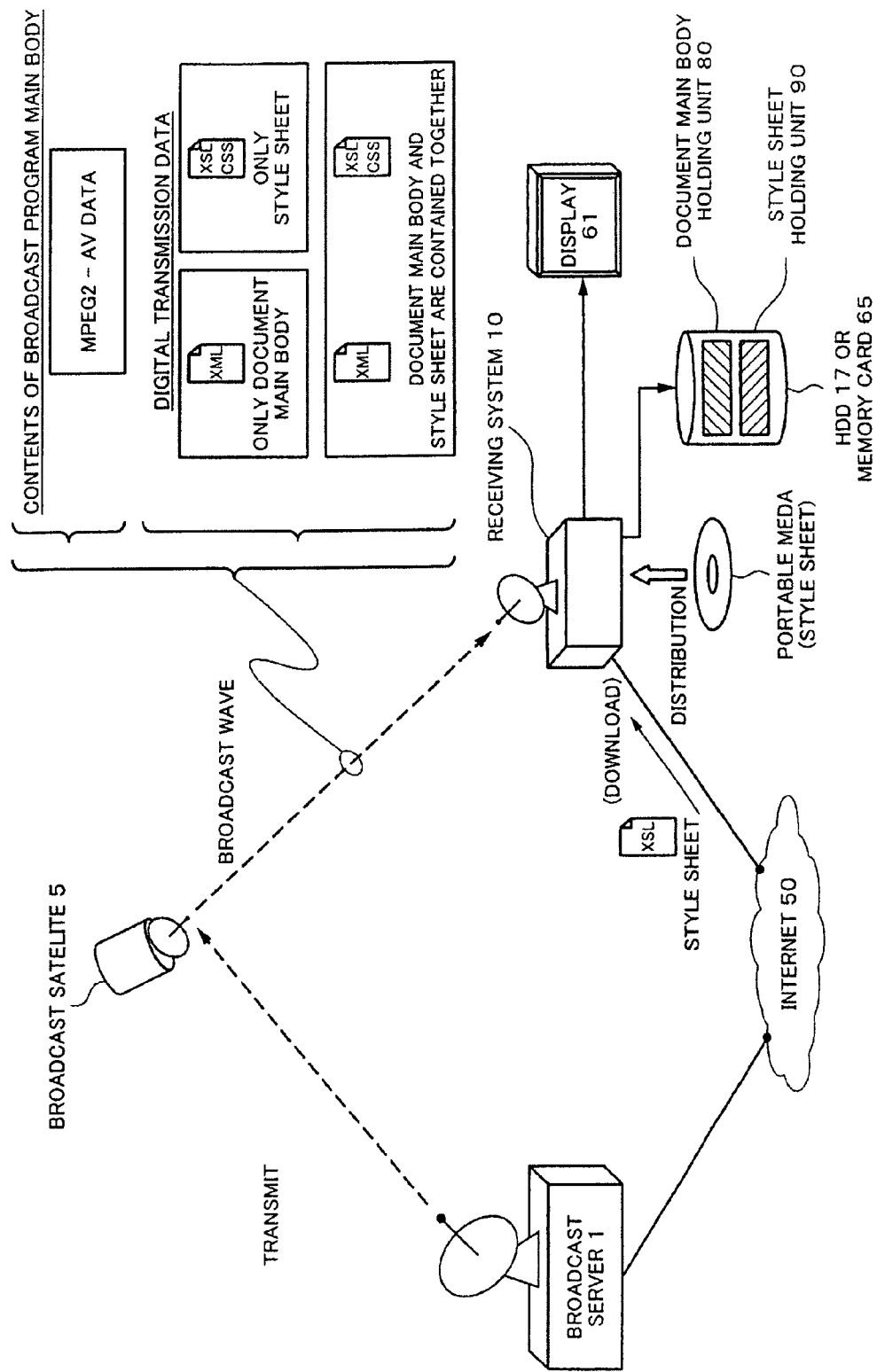
FIG. 6 is a diagram showing a state where broadcast content is transferred from the broadcast server to the receiver/decoder through a broadcast satellite.

In the digital satellite broadcast system, as shown in FIG. 6, a broadcast wave is first transmitted from the broadcast server 1 to the satellite 5 and transferred from the satellite 5 to the receiver/decoder 10. The contents of the transmission broadcast wave is constructed by: video and audio data (AV data) constructing the satellite broadcast program main body; and digital transmission data accompanied by the broadcast program main body.

Figure 7:
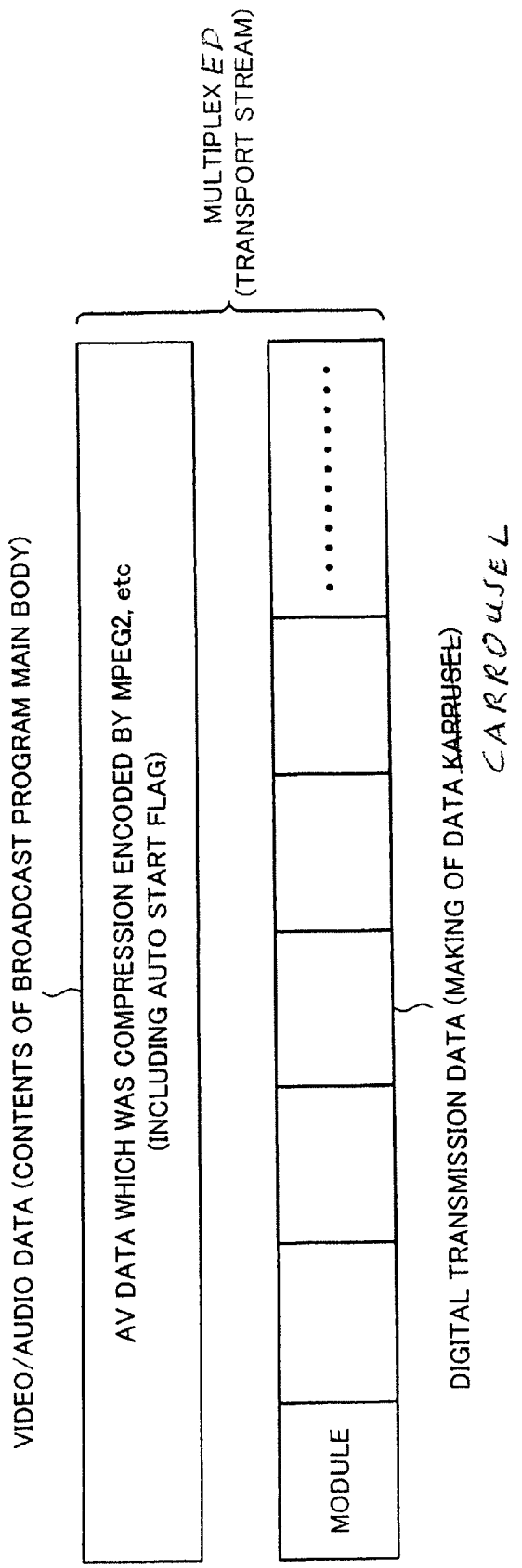
FIG. 7 is a diagram showing a construction of the broadcast content which is propagated as a broadcast wave.

FIG. 7 schematically shows a construction of broadcast content which is propagated as a broadcast wave. As shown in the diagram, the broadcast content is constructed as "transport stream" obtained by multiplexing the AV data which was compressed by a predetermined compression system such as MPEG (Motion Picture Experts Group) 2 or the like and the digital transmission data (the transport stream is classified into a transport layer of the OSI (Open Systems Interconnection) reference model).

As already mentioned, the TS decoder 53 interprets the transport stream and separates into the AV data portion and the digital transmission data portion. The AV data portion is processed by the AV decoder 54. The digital transmission data portion is processed by the CPU 11.

The digital transmission data portion comprises a plurality of modules. Each module includes an EPG, advertisement information, and other various information associated by the broadcast program main body. The digital transmission data portion has been formed as a data carrousel (merry-go-round data). Each module repetitively appears during the broadcast of the program main body (thus, the receiving system 10 as a viewer can obtain the module at an arbitrary timing in the program broadcast period and a memory for cache can be omitted). An automatic start flag for synchronizing with a display output timing of the module can be embedded into the MPEG2 compressed AV data.

Figure 8:
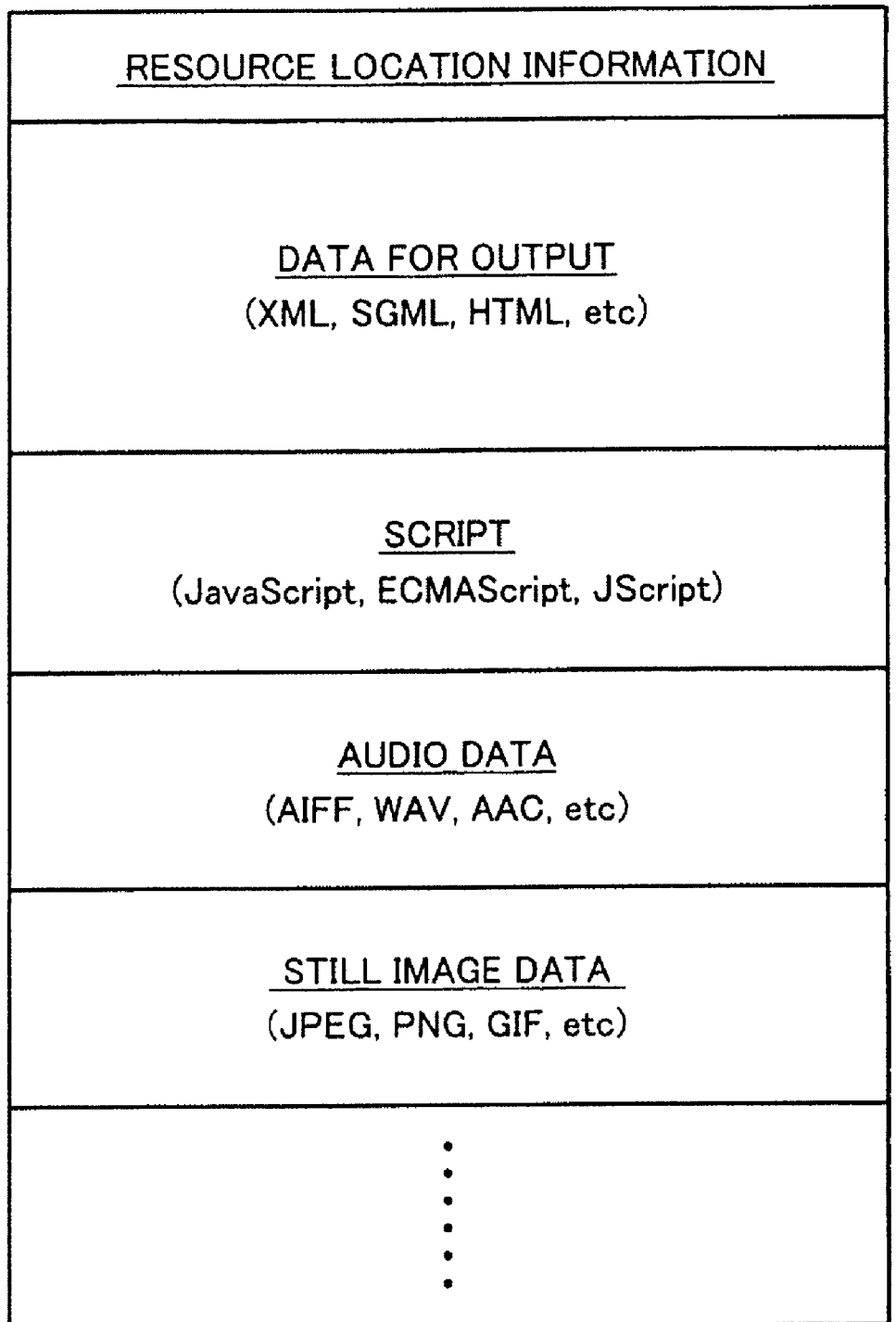
FIG. 8 is a diagram showing a data structure of a module constructing the digital transmission data.

FIG. 8 schematically shows a data structure of the module. As shown in the diagram, one module comprises a plurality of resource elements such as control program (multimedia encoding application) which specifies a state of display or output of the data broadcast, monomedia data such as script which specifies the operation, audio sound, text data, still image, motion image, etc., and the like. Each monomedia data is an object constructing a part of the data broadcast and integratedly handled by the multimedia encoding application.

Each resource element constructing the module is an independent file having a predetermined format. The audio data is described by, for example, an audio dedicated file format such as AIFF, WAV, AAC, or the like. The still image is described by an image dedicated file format such as JPEG, PNG, GIF, or the like. The head resource location information describes the position information of each resource element in the module.

The "multimedia encoding application" is a program for controlling a state of display and output of the EPG, advertisement information, and other various data broadcast accompanied by the broadcast program main body and is an XML application described in the XML (eXtensible Markup Language) format. However, it is not necessarily limited to the XML language but can be also described in another markup language format such as SGML, HTML, or the like. The XML document can include the DTD document for defining a document type. Since the style information which designates the actual expressing format is not incorporated in the XML document, a style sheet can be also annexed.

The style sheet is a data file in which an actual expressing format of the XML document as output content (further, it can also include multimedia content such as other audio sound, still image, and the like) has been specified. The style sheet is a document file described in the XSL (eXtensible Stylesheet Language) format for converting the XML document into a format for displaying and outputting onto the display 61 (or converting into a print output format to the printer (not shown)).

Separately from the style sheet, a script in which the operation of the multimedia content comprising various monomedia data such as audio sound, text, still image, motion image, and the like has been specified can be also distributed (for example, the script is described by a script language such as JavaScript, ECMAScript, Jscript, or the like. However, according to the standard of XML, XSL, or the like, it is fundamentally specified so that it is described by ECMAScript).

On the receiving system 10 side, necessary one of the received distribution content is temporarily stored in a local storing device such as an HDD 17 (or memory card 65) of the system 10.

In a unidirectional transmission environment like a satellite broadcast, the content described by the standard XML language is transmitted in a form in which the XML document and the style sheet are contained together so long as the style sheet which is used is not limited.

In the embodiment, with respect to the digital transmission data portion in the broadcast content, besides a case where the output content (XML document) and the style sheet (XSL document, CSS document, or the like) are contained together, a case of the transmission of only the XML document main body or the transmission of only the XSL document is also presumed. The XSL document can be supplied in a form of transmission or distribution other than the broadcast, for example, it can be supplied by a file download via the network such as Internet or supplied from a portable memory medium such as FD, CD-ROM, MO, Memory Stick (trademark), or the like in which the XSL document has been held.

In the receiving system 10 according to the embodiment, the supplied XML document and XSL document (or CSS document or the like) are separated and stored. That is, the HDD 17 (or memory card 65) to store the supplied document files is provided with: a document main body holding unit 80 for holding and managing only the XML document (however, the DTD document can be also contained); and a style sheet holding unit 90 for holding and managing only the XSL document as a style sheet.

Subsequently, in the digital satellite broadcast receiving system 10, a processing procedure for allowing the broadcast server 1 to transmit the digital transmission data portion will be described.

As already been mentioned above, the content which is distributed by the broadcast server 1 includes the digital transmission data in addition to the MPEG2 compressed AV data as a broadcast program main body. As described with reference to FIGS. 7 and 8, each module constructing the digital transmission data includes two files constructed by the text format data. One of them is an output data file and its content is described by a markup description language (XML, HTML, or the like) in which the data attributes are defined by a tag.

Another text format data included in the module is a script which specifies the operation of various media data such as audio sound, still image, motion image, and the like. For example, this script is described by a script language such as JavaScript, ECMAScript, JScript, or the like (according to the standard of XML, XSL, or the like, it is fundamentally specified so as to describe it by ECMAScript). The script is a script in which the processing procedure for allowing the software to execute is described in a text format and ordinarily used for automating a series of processes in which operating procedures which can be controlled by the end user have been combined on the application or OS.

In the output data itself described in the XML format or the like, the information itself which is screen displayed or print outputted is specified, and it is improper to permit the change in content of the text data of it.

On the other hand, the function name, variable name, comment sentence, or the like included in the source code of the script includes redundancy and is fatal on the transmitting efficiency. The function name, variable name, or the like has inherently been named by the person who made the script for the purpose of convenience of readability by human eyes or the like (or in accordance with a personal favor) and has no relation with the operating function that is specified by the script itself. In other words, those function name and variable name have exchangeability with another character string while maintaining the operating function of the script itself. The comment sentence has no relation with the execution of the script and can be also omitted.

The invention is made by paying attention to the redundancy incorporated by the script described in such a text format. In brief, according to the invention, the data size of the script is reduced by replacing the function name or variable name which exists in the script and comprises a relatively long character string with a shorter character string (for example, one alphabetical character). Further, the data size is reduced by deleting the comment sentence in the script.

Figure 9:
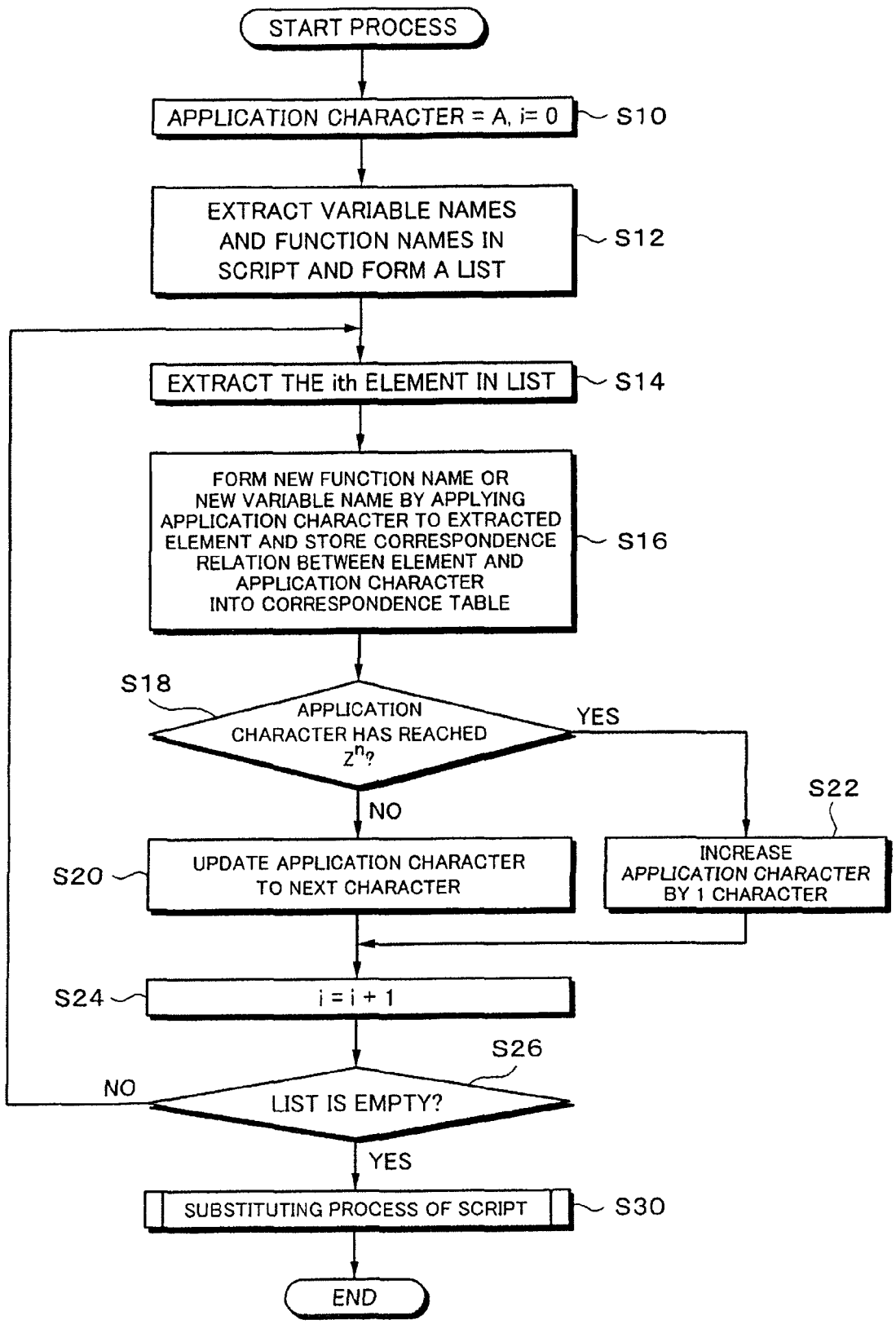
FIG. 9 is a flowchart showing a processing routine for converting a script.

In FIG. 9, a processing routine for converting the script file in the text format is shown in a form of a flowchart. For example, the script file conversion processing routine is executed by the program producer in the broadcast server 1 (more specifically speaking, the editing system 101 of the producing unit 100 (refer to FIG. 2)) after completion of the making of the digital transmission data. Each step of the flowchart will be described below.

First, in step S10, a character string of low redundancy (hereinafter referred to as "application characters") that is to be substituted for a character string of high redundancy and a variable i are set to initial values. In the embodiment, one alphabetical character is used as application characters in the ascending order. It is assumed that when the application characters start from A and reach Z, the number of characters is increased one by one in the ascending order such as AA, AB, AC, . . . , ZZ, AAA, . . . .

The ECMAScript has a rule such that the reserved word starts from a small letter. Therefore, if the script as a processing target is described in the ECMAScript format, by specifying that the application characters start with a capital letter, the coincidence with the reserved word of the ECMAScript can be easily eliminated. In this case, therefore, a discrimination about whether the application characters coincide with the reserved word of the script or not (step S23 in FIG. 12 which will be explained below) is unnecessary.

Subsequently, in step S12, by scanning the script as a processing target, the character strings of the high redundancy are extracted and listed.

The character strings of the high redundancy here are, for example, the function name and variable name. They have the high redundancy as a result of using the words having a meaning in order to raise the readability by human eyes for coding or debugging. For example, the function name and variable name can be extracted from the script in accordance with the following rules. That is, (1) A word which follows just after the reserved word "function" is a function name.

(2) The content in the parentheses which follows just after the function name is a train of a variable name and a comma.

(3) The next word of after the reserved word "var" is a variable name.

(4) The substituted left side is a variable name.

Subsequently, the first element (that is, the original function name and variable name) in the list is extracted (step S14). By applying the application characters to this element, a new function name or variable name is set and a correspondence relation between the element and the application characters is stored in a correspondence table (step S16). The formed correspondence table is shown in Table 1 which will be explained below.

In step S18, a discrimination of whether or not the application characters have reached Zn is carried out, namely, it is determined whether the application characters is a character string consisting of only the letter Z (where the number n of character strings is expressed by the power of n).

If the discrimination result is NO, step S20 follows and the application characters are updated to the next character string in the ascending order of the alphabet. If the discrimination result is YES, step S22 follows and the application characters are increased by one character in the ascending order of the alphabet (for example, if the application characters are equal to Z, they are updated to AA, and if the application characters are equal to ZZ, they are updated to AAA).

Subsequently, in step S24, i is increased by "1" and the processing routine advances to the next element in the list. In step S26, it is determined whether an unprocessed element remains in the list. If an unprocessed entry remains, the processing routine is returned to step S14 and processes similar to those mentioned above are repetitively executed to the next element. If all of the elements in the list have been registered into the correspondence table, the processing routine advances to a subsequent script substitution processing routine (S30). In this routine, the application characters of the low redundancy are substituted for the redundant character string such as function name, variable name, etc. in the original script, thereby compressing the size of script. The whole processing routine is finished.

Figure 11:
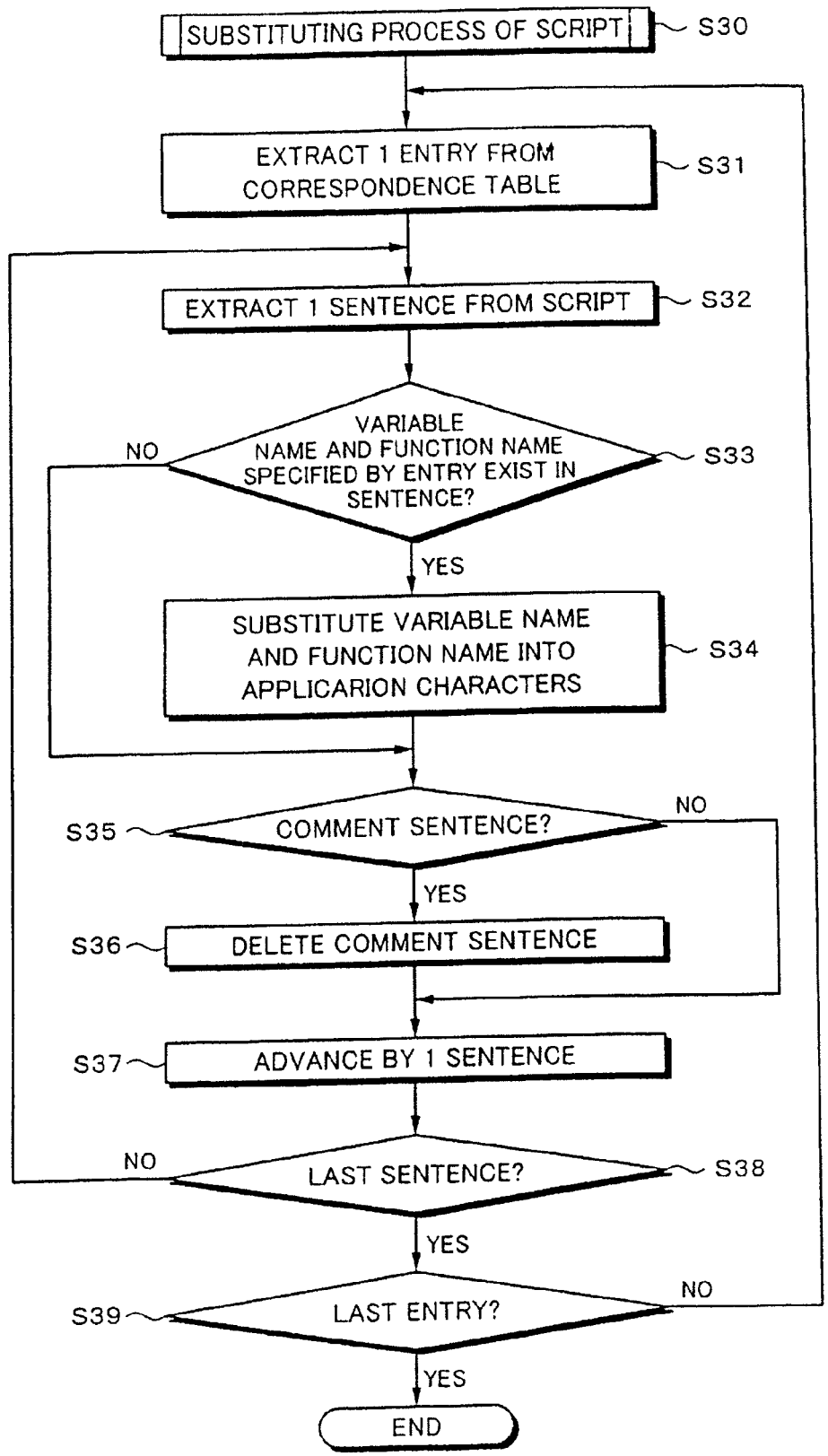
FIG. 11 is a flowchart showing a script substitution processing routine defined separately.

The script substituting process in step S30 is a processing routine which has separately been defined and its processing procedure is shown in FIG. 11 in a form of a flowchart. Each step in the flowchart will now be described.

First, in step S31, one entry is extracted from the correspondence table (refer to Table 1). Subsequently, in step S32, one sentence is extracted from the original script. It is now assumed that the sentence here indicates a character string from a blank to the next blank or the next new paragraph position and no blank is included.

In step S33, a discrimination of whether or not the variable name or function name specified by the entry exists in the sentence is carried out. If the discrimination result is NO, next step S34 is skipped. If the discrimination result is YES, the corresponding application characters are substituted for the variable name or function name in step S34.

Subsequently, in step S35, whether or not the sentence is a comment sentence is discriminated. If it is a script in the ECMAScript format, the comment sentence is a character string to the next new paragraph position after a delimiter "//". If the discrimination result is YES, step S36 follows and this comment sentence is deleted from the script.

Subsequently, in step S37, it is tried to obtain the next sentence. In step S38, whether or not the sentence is the last sentence is discriminated. If another sentence remains, the processing routine is returned to step S32 and processes similar to those mentioned above are repetitively executed to the next sentence.

If the sentence is the last sentence, whether the entry is the last entry in the correspondence table or not is discriminated (step S39). If another entry remains, the processing routine is returned to step S31, and processes similar to those mentioned above are repetitively executed with respect to the correspondence relation which is specified by the next entry. If the processes regarding all of the correspondence relations are completed, the processing routine is finished.

It is desirable that the script converting process is executed when the script is formed in the producing unit 100 and the script obtained after the converting process is stored as a resource into the storing device 102 of a large capacity. Although a method of converting the script just before sending instead of converting at the timing just after the formation of the script is also considered, in this case, since a module size of resource is changed, there is a possibility that it is necessary to reconstruct the module. It is, therefore, preferable to execute the converting process upon formation of the script. (For example, in the case where one module has been divided into two or more modules and stored before the converting process due to a limitation of the module length, there is also a case where it is fitted within a single module length by the converting process.)

Figure 10:
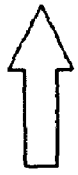
FIG. 10 is a diagram showing a comparison between source codes of the scripts before and after the execution of the converting process shown in FIG. 9.

FIG. 10 shows a comparison between the source codes of the scripts before and after the execution of the converting process shown in FIG. 9. However, this script is text data described by the ECMAScript (ECMAScript is a script language standardized by European Computer Manufactures Association). It should be also noted that it is not a complete program but a partial extraction.

In the original source code, the character string (for example, "buildArray" or the like) which follows just after a reserved word "function" is a function name and becomes a target to be replaced with a shorter character string.

A substituted character string (for example, "temporary_argument" or the like) of the left side corresponds to a variable name and becomes a target to be similarly replaced with a short character string. Although the variables defined in the script have been mentioned, the essence of the invention is not limited to them. For example, the substituting process to the short character string can be also similarly applied to a variable as an operator which operates the attributes of the display encoding data in the document such as XML, HTML, or the like.

A character string which starts from the delimiter "//" and reaches the line end is a comment sentence. In the substituting process according to the embodiment, one sentence starting from "//" is searched in the source code and all of the characters to the line end are ignored, namely, deleted.

A correspondence table shown in the following Table 1 is formed as a result obtained by executing the converting process shown in FIG. 9 to the original source code shown in FIG. 10. The extracted character string of high redundancy such as variable name, function name, or the like is converted into application characters of low redundancy.

TABLE 1

| Character string after conversion | Character string before conversion (original function name, original variable name) |
|---|---|
| A | buildArray |
| B | temporary_argument |
| C | i |
| D | urls |
| E | go |
| F | which |
| G | number |
| H | resident |
| I | Index |
| J | url |

As will be understood with reference to FIG. 10, the variable name or function name in the original source code is replaced with one alphabetical character, and the comment sentence is deleted. As will be visually recognized from the diagram, a code amount is largely reduced and a transmitting efficiency is remarkably improved.

After the converting process, the processes themselves specified by the script are the same as those before conversion. Therefore, in the satellite broadcast receiving system 10 which receives the converted script, the execution system of the script can similarly handle it irrespective of whether the size reducing process has been performed or not.

The minimization of the character string length of the function name or variable name in the script is preferable also from a viewpoint of the executing efficiency in the receiving system 10. This is because the size of function table or variable table which is allocated to the memory by the interpreter for executing the script can be reduced, so that an overhead at the time when the function or variable is called decreases.

According to the script conversion processing routine shown in FIG. 9, by converting the function name or variable name which is redundant because it has the readability into the short character string from which the redundancy has been removed, that is, into the application characters, the size of script can be compressed to a preferable size.

If the number of function names and variable names as substitution targets is equal to or less than 26, that is, if it is equal to or less than the total number of alphabetical characters, even if the substituting processes to the application characters are executed in any order, the sizes after the conversion are the same.

On the other hand, if the number of substitution targets exceeds 26, the application characters of two or more characters besides the application character of one character are used (refer to step S22 in FIG. 9). By substituting a short character string for a longer character string, a higher data compressing effect is obtained.

Figure 12B:
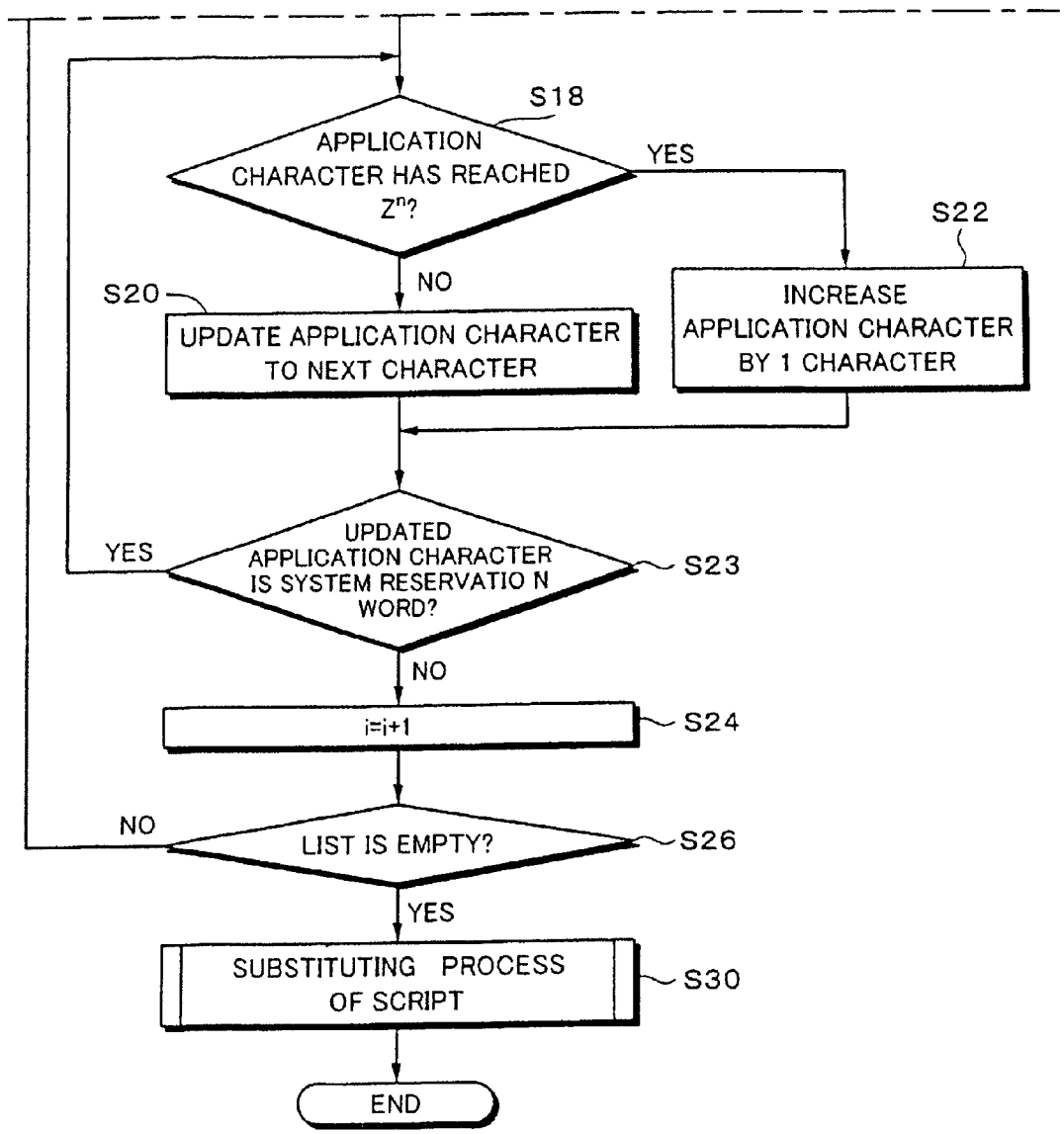
FIG. 12 is a flowchart showing another example of a processing routine for converting the script.

In FIG. 12, an example of another script conversion processing routine different from that shown in FIG. 9 is shown in a form of a flowchart. In the flowchart, attention is paid to data compressing efficiency. That is, a step S13 of sorting the elements in the list again is inserted between steps S12 and S14. That is, in step S13, the elements in the list are sorted again in the order from the element of the large appearance frequency in the script. Thus, in the subsequent substituting processes, the characters or character string of a large appearance frequency is replaced with characters or character string whose number of characters is small, so that the data compressing effect results.

In the routine shown in FIG. 12, discrimination of whether or not the updated application characters are a system reserved word is carried out (step S23) between steps S20 and S24. If the updated application characters are the reserved word, the processing routine is returned to step S18 and they are removed from the targets of the character string conversion. This is because if they are converted into the reserved word, the inherent meaning of the original script, that is, the operation specified by the script is changed, so that it is improper to permit such a conversion.

The function name and variable name in the script have been named by the person who made the script for convenience of keeping the readability by human eyes of each function name or variable name and each of them is constructed by a relatively long character string having a meaning which can be understood by the person. Although the comment sentence is embedded into the source code in order to memorize the function of each portion (for example, routine sentence or the like) in the script, the comment sentence itself does not contribute to the realization of the function.

Although the function name or variable name consisting of a long character string and the comment sentence have a meaning to a position of the debug, it is unnecessary to have the meaning which can be interpreted by the person after the debug. Particularly, in case of applying the system to the unidirectional content distribution like a satellite broadcast, there is no need to consider the reuse of the source code at the stage after the transmission. In other words, even if the function name or variable name in the script is replaced with another short character string or the comment sentence is deleted and the source code loses the readability by human eyes, there is hardly any trouble by it.

By applying the invention to the digital transmission data in the digital satellite data broadcast, the size of transmission data can be reduced and the transmitting efficiency is improved upon distribution.

In the receiver/decoder, since the size of reception data decreases, it is sufficient to merely prepare a reception memory of a relatively small capacity, so that the costs are reduced. Since the character string length of the function name or variable name is minimized, a size of function table or variable table which is allocated to the memory by the interpreter for executing the script can be reduced. Thus, the overhead at the time when the function or variable is called decreases. That is, the executing efficiency of the script is improved, the memory capacity is reduced, so that the costs for the receiver can be decreased.

[Addition]

The present invention has been described in detail above with reference to the specific embodiments. However, it will be obviously understood that many modifications and variations of the embodiments are possible to those with ordinary skill in the art without departing from the spirit of the invention. That is, the invention has been disclosed in a form of embodiments and should not be limitatively interpreted. To judge the essence of the invention, the scope of claims should be considered.

As described in detail above, according to the invention, it is possible to provide an excellent data distributing technique which can improve the transmitting efficiency of the distribution content comprising the text data.

According to the invention, it is possible to provide an excellent data distributing technique which can improve the executing efficiency of the receiving apparatus for receiving the distribution content comprising the text data and reduce a memory load.

In case of applying the invention to the distribution of digital data of the digital satellite broadcast or the like, a data amount can be reduced without changing the processing contents of the style sheet described in the text format. Thus, in the broadcast server as a content distributing source, the transmitting efficiency of the distribution content can be improved while keeping the conventional forming operation of the style sheet.

On the receiver/decoder side, since the size of reception data decreases, it is sufficient to merely prepare the reception memory of a relatively small capacity, so that the costs can be reduced.

Further, since the length of character string of the function name or variable name in the script is minimized, the size of function table or variable table which is allocated to the memory by the interpreter for executing the script can be reduced. Thus, the overhead at the time when the function or variable is called decreases and the executing efficiency of the script is improved. Therefore, the user (namely, viewer) of the receiver can expect a higher reacting speed of the system owing to the improvement of the executing efficiency.

On the broadcast server side which distributes the script, since the meaning and contents of the scripts before and after the conversion are not changed, the script can be driven on the reception side by using the existing interpreting software. In other words, an extra software development is unnecessary.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A processor implemented method of forming unidirectional distribution content that includes a data module, the data module including a script, said method comprising:
   using a processor implemented editing system to execute the following:
      scanning the script to detect a plurality of character strings that are not reserved words and not operational symbols and that each match predetermined criteria,
      sorting the plurality of character strings in order of their appearance frequency in the script,
      associating, for each one of the plurality of character strings, that character string with a specific one of a plurality of substitute characters or character strings such that when a respective one of the plurality of character strings has a greater appearance frequency than another one of the plurality of character strings, the specific one of the plurality of substitute characters or character strings that is associated with the respective one of the plurality of character strings has a same or smaller number of characters than the specific one of the plurality of substitute characters or character strings that is associated with the another one of the plurality of character strings, and
      for each one of the plurality of character strings,
         searching the script for that character string, and
         replacing each occurrence of that character string in the script with its associated substitute character or character string, the associated substitute character or character string having fewer characters than the replaced character string; and unidirectionally distributing, using a transmitting unit, the content that includes the data module that includes the script whereby the plurality of character strings is not distributed.

2. A processor implemented method according to claim 1, further comprising:

using the processor implemented editing system to execute the following: temporarily storing the distribution content, after carrying out said replacing step, prior to said step of unidirectionally distributing the content.

3. A processor implemented method according to claim 1, wherein at least one of the plurality of character strings is a function name or a variable name, said scanning step detects that a particular one of the plurality of character strings is the function name when that character string immediately follows the term "function", the term "function" being a reserved word, and said scanning step detects that the particular one of the plurality of character strings is the variable name when that character string (i) is located between a left parenthesis and a right parenthesis that follow the function name and either precedes or follows a comma that is also located between the left parenthesis and the right parenthesis, (ii) is located on the left side of an equation, or (iii) immediately follows the term "var", the term "var" being a reserved word.

4. A processor implemented method according to claim 1, further comprising:

using the processor implemented editing system to execute the following: searching the script for a further one of the plurality of character strings that does not affect execution of the script; and deleting the further one of the plurality of character strings from the script.

5. A processor implemented method according to claim 4, wherein the further one of the plurality of character strings is a comment string preceded by a predetermined delimiter.

6. A processor implemented method according to claim 1, further comprising:

using the processor implemented editing system to execute the following: storing each one of the plurality of character strings and its associated substitute character or character string in a correspondence table.

7. A processor implemented method of unidirectionally distributing content that includes a plurality of data modules, at least one of the plurality of modules including a script, said method comprising:

using a processor implemented editing system to execute the following:

scanning the script of the at least one data module to detect a plurality of character strings that are not reserved words and not operational symbols and that each match predetermined criteria, sorting the plurality of character strings in order of their appearance frequency in the script, associating, for each one of the plurality of character strings, that character string with a specific one of a plurality of substitute characters or character strings such that when a respective one of the plurality of character strings has a greater appearance frequency than another one of the plurality of character strings, the specific one of the plurality of substitute characters or character strings that is associated with the respective one of the plurality of character strings has a same or smaller number of characters than the specific one of the plurality of substitute characters or character strings that is associated with the another one of the plurality of character strings, for each one of the plurality of character strings, searching the script of the at least one data module for that character string, and replacing each occurrence of that character string in the at least one data module with its associated substitute character or character string, the associated substitute character or character string having fewer characters than the replaced character string, and storing the at least one data module after carrying out said searching and replacing steps for each one of the plurality of character strings; and unidirectionally distributing, using a transmitting unit, the stored at least one data module whereby the plurality of character strings is not distributed.

8. A processor implemented method according to claim 7, wherein at least one of the plurality of character strings is a function name or a variable name, said scanning step detects that a particular one of the plurality of character strings is the function name when that character string immediately follows the term "function", the term "function" being a reserved word, and said scanning step detects that the particular one of the plurality of character strings is the variable name when that character string (i) is located between a left parenthesis and a right parenthesis that follow the function name and either precedes or follows a comma that is also located between the left parenthesis and the right parenthesis, (ii) is located on the left side of an equation, or (iii) immediately follows the term "var", the term "var" being a reserved word.

9. A processor implemented method according to claim 7, further comprising:

using the processor implemented editing system to execute the following: searching the script for a further one of the plurality of character strings that does not affect execution of the script; and deleting the further one of the plurality of character strings from the script.

10. A processor implemented method according to claim 9, wherein the further one of the plurality of character strings is a comment string preceded by a predetermined delimiter.

11. A processor implemented method according to claim 7, further comprising:

using the processor implemented editing system to execute the following: storing each one of the plurality of character strings and its associated substitute character or character string in a correspondence table.

12. An apparatus for unidirectionally distributing content that includes a plurality of data modules, at least one of the plurality of modules including a script, said apparatus comprising:

a processor implemented editing system, including:

means for scanning the script to detect a plurality of character strings that are not reserved words and not operational symbols and that each match predetermined criteria, means for sorting the plurality of character strings in order of their appearance frequency in the script, means for associating, for each one of the plurality of character strings, that character string with a specific one of a plurality of substitute characters or character strings such that when a respective one of the plurality of character strings has a greater appearance frequency than another one of the plurality of character strings, the specific one of the plurality of substitute characters or character strings that is associated with the respective one of the plurality of character strings has a same or smaller number of characters than the specific one of the plurality of substitute characters or character strings that is associated with the another one of the plurality of character strings, means for searching the script of the at least one data module for each one of the plurality of character strings, and for replacing each occurrence of each one of the plurality of character strings in the script with its associated substitute character or character string, the associated substitute character or character string having fewer characters than the replaced character string, and means for storing the at least one data module after replacing each occurrence of each one of the plurality of character strings with its associated substitute character or character string; and a transmitting unit, including:

means for unidirectionally distributing the stored at least one data module whereby the plurality of character strings is not distributed.

13. An apparatus according to claim 12, wherein at least one of the plurality of character strings is a function name or a variable name, said means for scanning detects that a particular one of the plurality of character strings is the function name when that character string immediately follows the term "function", the term "function" being a reserved word, and said means for scanning detects that the particular one of the plurality of character strings is the variable name when that character string (i) is located between a left parenthesis and a right parenthesis that follow the function name and either precedes or follows a comma that is also located between the left parenthesis and the right parenthesis, (ii) is located on the left side of an equation, or (iii) immediately follows the term "var", the term "var" being a reserved word.

14. An apparatus according to claim 12, wherein the processor implemented editing system further comprises:

means for searching the script for a further one of the plurality of character strings that does not affect execution of the script; and means for deleting the further one of the plurality of character strings from the script.

15. An apparatus according to claim 14, wherein the further one of the plurality of character strings is a comment string preceded by a predetermined delimiter.

16. An apparatus according to claim 12, wherein the processor implemented editing system further comprises:

means for storing each one of the plurality of character strings and its associated substitute character or character string in a correspondence table.

17. A processor implemented method of reducing the size of unidirectionally distributed source code, said method comprising:

using a processor implemented editing system to execute the following:

scanning the source code to detect a plurality of character strings that are not reserved words and not operational symbols and that each match predetermined criteria, sorting the plurality of character strings in order of their appearance frequency in the source code, associating, for each one of the plurality of character strings, that character string with a specific one of a plurality of substitute characters or character strings such that when a respective one of the plurality of character strings has a greater appearance frequency than another one of the plurality of character strings, the specific one of the plurality of substitute characters or character strings that is associated with the respective one of the plurality of character strings has a same or smaller number of characters than the specific one of the plurality of substitute characters or character strings that is associated with the another one of the plurality of character strings, and for each one of the plurality of character strings, searching the source code for that character string, and replacing each occurrence of that character string in the script with its associated substitute character or character string, the associated substitute character or character string having fewer characters than the replaced character string; and unidirectionally distributing, using a transmitting unit, the source code whereby the plurality of character strings is not distributed.

18. A processor implemented method according to claim 17, wherein at least one of the plurality of character strings is a function name or a variable name, said scanning step detects that a particular one of the plurality of character strings is the function name when that character string immediately follows the term "function", the term "function" being a reserved word, and said scanning step detects that the particular one of the plurality of character strings is the variable name when that character string (i) is located between a left parenthesis and a right parenthesis that follow the function name and either precedes or follows a comma that is also located between the left parenthesis and the right parenthesis, (ii) is located on the left side of an equation, or (iii) immediately follows the term "var", the term "var" being a reserved word.

19. A processor implemented method according to claim 17, further comprising:

using the processor implemented editing system to execute the following: searching the source code for a further one of the plurality of character strings that does not affect execution of the source code, and deleting the further one of the plurality of character strings.

20. A processor implemented method according to claim 19, wherein the further one of the plurality of character strings is a comment string preceded by a predetermined delimiter.

21. A processor implemented method according to claim 17, further comprising:

using the processor implemented editing system to execute the following: storing each one of the plurality of character strings and its associated substitute character or character string in a correspondence table.

* * * * *